(12) United States Patent
Hatakeyama et al.

(10) Patent No.: US 7,871,761 B2
(45) Date of Patent: *Jan. 18, 2011

(54) RESIST LOWER LAYER MATERIAL, RESIST LOWER LAYER SUBSTRATE COMPRISING THE MATERIAL AND METHOD FOR FORMING PATTERN

(75) Inventors: Jun Hatakeyama, Joetsu (JP); Toshihiko Fujii, Joetsu (JP); Youichi Ohsawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 761 days.

This patent is subject to a terminal disclaimer.

(21) Appl. No.: 11/881,761

(22) Filed: Jul. 27, 2007

(65) Prior Publication Data

US 2008/0032231 A1    Feb. 7, 2008

(30) Foreign Application Priority Data

Aug. 1, 2006    (JP) .............................. 2006-209699

(51) Int. Cl.
*G03F 7/26* (2006.01)
*G03F 7/095* (2006.01)

(52) U.S. Cl. ................. 430/323; 430/271.1; 430/272.1; 430/276.1; 430/919; 430/925

(58) Field of Classification Search .............. 430/270.1, 430/271.1, 272.1, 276.1, 323, 919, 925
See application file for complete search history.

(56) References Cited

U.S. PATENT DOCUMENTS

| | | | |
|---|---|---|---|
| 5,091,282 A * | 2/1992 | Onishi et al. ............. | 430/270.1 |
| 5,886,119 A | 3/1999 | Schaedeli et al. | |
| 5,972,560 A | 10/1999 | Kaneko et al. | |
| 6,028,154 A | 2/2000 | Schaedeli et al. | |
| 6,042,989 A | 3/2000 | Schaedeli et al. | |
| 6,309,796 B1 | 10/2001 | Nakashima et al. | |
| 6,420,088 B1 | 7/2002 | Angelopoulos et al. | |
| 6,506,497 B1 | 1/2003 | Kennedy et al. | |
| 6,514,874 B1 * | 2/2003 | Yu et al. .................... | 438/744 |
| 6,623,909 B2 | 9/2003 | Hatakeyama et al. | |
| 6,730,453 B2 | 5/2004 | Nakashima et al. | |
| 6,767,689 B2 | 7/2004 | Pavelchek et al. | |
| 6,849,374 B2 | 2/2005 | Cameron et al. | |
| 6,887,648 B2 | 5/2005 | Pavelchek et al. | |
| 6,908,722 B2 | 6/2005 | Ebata et al. | |
| 7,163,778 B2 | 1/2007 | Hatakeyama et al. | |
| 7,514,202 B2 * | 4/2009 | Ohsawa et al. ........... | 430/270.1 |
| 2003/0113658 A1 * | 6/2003 | Ebata et al. .............. | 430/270.1 |
| 2003/0170561 A1 | 9/2003 | Iwasawa et al. | |
| 2005/0123859 A1 * | 6/2005 | Wada et al. ................. | 430/313 |
| 2005/0277058 A1 * | 12/2005 | Iwabuchi et al. ......... | 430/270.1 |
| 2006/0068335 A1 | 3/2006 | Coley et al. | |
| 2007/0122740 A1 * | 5/2007 | Hatakeyama et al. .... | 430/270.1 |
| 2007/0264596 A1 * | 11/2007 | Ohsawa et al. .............. | 430/311 |
| 2007/0275325 A1 * | 11/2007 | Hatakeyama et al. .... | 430/270.1 |
| 2008/0038662 A1 * | 2/2008 | Hatakeyama et al. .... | 430/270.1 |

FOREIGN PATENT DOCUMENTS

| | | |
|---|---|---|
| JP | 5-267158 A | 10/1993 |
| JP | 5-291130 A | 11/1993 |
| JP | 6-118651 A | 4/1994 |
| JP | 9-110938 A | 4/1997 |
| JP | 10-324748 A | 12/1998 |
| JP | 11-302382 A | 11/1999 |
| JP | 2002-055456 A | 2/2002 |
| JP | 2002-372829 A | 12/2002 |
| JP | 2003-114533 A | 4/2003 |
| JP | 2003-173027 A | 6/2003 |
| JP | 2004-028506 A | 1/2004 |
| JP | 2004-177666 A | 6/2004 |
| JP | 2004-179393 A | 6/2004 |
| JP | 2004-531749 W | 10/2004 |
| JP | 2004-307387 | 11/2004 |
| JP | 2004-310019 A | 11/2004 |
| JP | 2005-120636 A | 5/2005 |
| JP | 2005-331951 A | 12/2005 |
| JP | 2006-117763 A | 5/2006 |

OTHER PUBLICATIONS

Brunsvold et al. "Evaluation of a Deep UV Bilayer Resist for Sub-Half Micron Lithography", *SPIE* 1925:377-387.
Hatakeyama et al. "Investigation of Discrimination Enhancement in Polysilsesquioxane Based Positive Resist for ArF Lithography", *SPIE* 3333:62-72.
Lynch et al. "Properties and Performance of Near UV Reflectivity Control Layers", *SPIE* 2195:225-235.
Moran et al. "High resolution, steep profile resist patterns" *J. Vac. Sci. Technol.* 16(6):1620-1624 (1979).

(Continued)

*Primary Examiner*—Cynthia H Kelly
*Assistant Examiner*—Anca Eoff
(74) *Attorney, Agent, or Firm*—Myers Bigel Sibley & Sajovec, P.A.

(57) ABSTRACT

Provided is a method for forming a resist lower layer material for use in a multilayer resist process, especially two-layer resist process or three-layer resist process, having a function of neutralizing an amine contaminant from a substrate, thereby reducing a harmful effect such as trailing skirts of a resist pattern of an upper layer resist. Specifically, there is provided a material for forming a lower layer of a chemically amplified photoresist layer comprising a crosslinkable polymer and a thermal acid generator that can generate an acid by heating at 100° C. or greater and is represented by the general formula (1a):

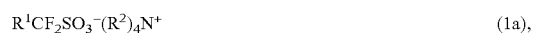

as well as a resist lower layer substrate comprising a resist lower layer formed using said material.

5 Claims, 2 Drawing Sheets

OTHER PUBLICATIONS

Nagahara et al. "Elimination of Resist Poisoning in Via-First Dual Damascene Processes" *J. of Photopolymer Sci. and Tech.* 16(3):351-361 (2003).

Schaedeli et al. "Evaluation of Materials for 193-nm Lithography" *J. of Photopolymer Sci. and Tech.* 9(3):435-446 (1996)6.

* cited by examiner

RESIST LOWER LAYER MATERIAL, RESIST LOWER LAYER SUBSTRATE COMPRISING THE MATERIAL AND METHOD FOR FORMING PATTERN

CROSS-RELATED APPLICATIONS

This application claims priority from Japanese Patent Application No. 2006-209699; filed Aug. 1, 2006, the disclosure of which is incorporated herein by reference in its entirety.

BACKGROUND OF THE INVENTION

1. Field of the Invention

The present invention relates to a resist lower layer material of a multilayer resist film for use in microprocessing in the production process of semiconductor devices, and particularly to a resist lower layer material of a multilayer resist film suitable for exposure with a far ultraviolet ray, KrF excimer laser light (248 nm), ArF excimer laser light (193 nm), $F_2$ laser light (157 nm), $Kr_2$ laser light (146 nm), $Ar_2$ laser light (126 nm) or the like. The present invention further relates to a method for forming a pattern on a substrate by lithography using the resist lower layer material.

2. Description of the Related Art

With the higher integration and higher operation speed of LSIs in recent years, demand is growing for finer pattern rules. However, lithography with optical exposure, the currently most commonly used technique, has almost reached the limit in terms of inherent resolution defined by the wavelength of light sources.

As the light source for lithography used when forming a resist pattern, exposure light using g-line (436 nm) or i-line (365 nm) of mercury lamps as a light source is widely used for the optical exposure, and as means for obtaining further finer patterns, the method of shortening the wavelength of exposure light has been considered effective. For this reason, in the mass production process for 64 M bit DRAMs, for example, KrF excimer laser (248 nm) having a short wavelength is employed as the exposure light source instead of i-line (365 nm). However, the production of DRAMs having an integration degree of 1 G or more, which requires a further finer microfabrication technique (e.g., processing size: 0.13 µm or less), requires the use of a light source having a shorter wavelength, and particularly a lithography that employs ArF excimer laser (193 nm) is under development.

A multilayer resist process such as two-layer resist process is conventionally known as being excellent in forming a pattern having a high aspect ratio on a stepped substrate. In order to develop a two-layer resist film with a commonly available alkaline developer in two-layer resist process, it is considered preferable to use a high molecular weight silicone compound having a hydrophilic group such as a hydroxy group or carboxyl group for forming a resist upper layer.

In relation to the high molecular weight silicone compound, chemically amplified silicone-based positive resist materials are proposed for KrF excimer laser which comprises a base polymer and an acid generator, the base polymer comprising polyhydroxybenzylsilsesquioxane, a stable alkali soluble silicone polymer, whose phenolic hydroxyl group is partially protected by a t-Boc group (see, for example, Japanese Patent Application Unexamined Publication 6-118651/1994 and SPIE vol. 1925 (1993) p 377). For ArF excimer laser, a positive resist comprising as a base polymer silsesquioxane in which cyclohexyl carboxylic acid is substituted by an acid-labile group is proposed (see, for example, Japanese Patent Application Unexamined Publication No. 10-324748/1998, Japanese Patent Application Unexamined Publication No. 11-302382/1999 and SPIE vol. 3333 (1998) p 62). For $F_2$ laser, a positive resist comprising as a base polymer silsesquioxane having hexafluoroisopropanol as a soluble group is proposed (see, for example, Japanese Patent Application Unexamined Publication No. 2002-55456). These polymers contain polysilsesquioxane containing a ladder frame by polycondensation of trialkoxysilane or a trihalogenated silane in the main chain.

As the high molecular weight silicone compound in which silicon is suspended from a side chain, silicon-containing (meta) acrylic ester-based polymer is proposed (see, for example, Japanese Patent Application Unexamined Publication No. 9-110938/1997, and J. Photopolymer Sci. and Technol. Vol. 9 No. 3 (1996) pp 435 to 446)

The resist lower layer material for use in two-layer resist process can comprise, for example, a hydrocarbon compound that can be etched with an oxygen gas, or the like. Because the resist lower layer serves as a mask when the substrate under the resist lower layer is etched, it is preferable that the resist lower layer has a high etching resistance when the substrate is etched. When the resist lower layer is etched with an oxygen gas using the resist upper layer as a mask, the resist lower layer may be preferably composed only of a hydrocarbon containing no silicon atom. In order to improve the line width controllability of the resist upper layer containing a silicon atom, to suppress the unevenness of the sidewall of a pattern and the collapse of the pattern due to a stationary wave it is preferable that the resist lower layer has also a function of serving as an anti-reflection film. Specifically, it is preferable that the reflectivity from the lower layer into the resist upper layer is kept at 1% or less.

Meanwhile, proposed is a process for three-layer resist wherein a resist upper layer of a monolayer resist containing no silicon, a resist intermediate layer containing silicon, and a resist lower layer of an organic film are laminated in this order (see, for example, J. Vac. Sci. Technol., 16(6), November/December 1979).

Generally speaking, a monolayer resist containing no silicon is more excellent in resolution than a silicon-containing resist, and thus a high resolution monolayer resist can be used as an exposed imaging layer in three-layer resist process.

As the resist intermediate layer, a spin-on-glass (SOG) film is used, and many SOG films are proposed.

In three-layer resist process, the optimal optical constant of resist lower layer for suppressing the reflection of substrate is different from that in two-layer resist process.

Both two-layer resist process and three-layer resist process have the same purpose of suppressing the reflection of substrate as much as possible, specifically, down to 1% or less. However, in two-layer resist process, the anti-reflection effect is imparted only to the resist lower layer, whereas in three-layer resist process, the anti-reflection effect can be imparted to either or both of the resist intermediate layer and the resist lower layer.

Silicon-containing layer materials having an anti-reflection effect imparted thereto are proposed in, for example, U.S. Pat. Nos. 6,506,497 and 6,420,088, and the like.

It is widely known that a multilayer anti-reflection film has a greater anti-reflection effect than a monolayer anti-reflection film, and thus the multilayer anti-reflection film is widely used in industrial applications such as optical components and eyeglasses.

By imparting an anti-reflection effect to both the silicon-containing resist intermediate layer and the resist lower layer, a high anti-reflection effect can be obtained.

As for the resist lower layer for use in three-layer resist process, the resist lower layer is required to have, in addition to the effect as an anti-reflection film, a high etching resistance in the processing of the substrate.

For this reason, it is preferable to use a polymer having a high etching resistance and a higher carbon atom content and containing many aromatic groups for a lower layer for use in three-layer process.

Under the circumstances, a low dielectric insulating film has been used recently as the treatment layer of a substrate. As a low dielectric insulating film for achieving a dielectric constant of 2.5 or less, porous silica having a dielectric constant of 1 has been under study.

However, when a porous silica-based low dielectric insulating film is used, a problem arises that trailing skirts (poisoning) occurs in the positive resist after development. The cause for this is presumed to be that an amine substance is adsorbed to the pores, and during a resist patterning process, particularly during baking, the amine substance is liberated from the pores through the resist lower layer to undergo a neutralization reaction with the acid comprised by the upper layer resist, causing the trailing skirts (see, for example, J. Photopolymer Sci. and Technol. Vol. 16 No. 3 (2003) pp 351 to 361). Therefore, development is desired for a resist lower layer that can reduce a harmful effect such as the trailing skirts of the upper layer resist caused by the amine substance.

As methods for preventing poisoning, a lower layer that can generate a sulfonic acid residue group by the application of heat or the like (see, for example, Japanese Patent Application Unexamined Publication Nos. 2004-177666 and JP 2004-179393), and a lower layer to which an amine salt of high molecular weight fluorosulfonic acid has been added (see, for example, Japanese Patent Application No. 2005-120636) are proposed. The lower layer to which a polymer having an acid group has been added is free from the evaporation of acid by baking, but because the acid group is immobilized, there is a disadvantage of low capability of neutralizing the basic substance generated from the substrate that can cause poisoning.

The method for improving the resist pattern by the addition of an acid or acid generator to the lower layer is conventionally known, and an intermediate film for three-layer resist process in which an ammonium salt that can generate antimonate has been added to a silicone resin (see, for example, Japanese Patent Application Unexamined Publication No. 5-267158/1993), an intermediate film for three-layer resist process in which an acid generator has been added (see, for example, Japanese Patent Application Unexamined Publication No. 5-291130/1993) and the like are proposed.

In the case where an acid generator is added, if the generated acid remains in the film, the anti-poisoning capability is high, but a problem arises that the anti-poisoning capability is reduced by the evaporation of acid during baking for crosslinking. Perfluorosulfonic acid, which is a super acid, is expected to exhibit a high anti-poisoning effect, but due to its low boiling point, perfluorosulfonic acid evaporates during baking, deteriorating the anti-poisoning effect. An alkylsulfonic acid such as camphorsulfonic acid has a high boiling point, but is weakly acid, and thus an alkylsulfonic acid has a low capability of trapping amine. An inorganic acid such as antimonite has a high boiling point and is a strong acid, but metal acids cannot be used for semiconductor applications. An ammonium salt has a thermal decomposition temperature lower than those of onium salts such as iodonium salt and sulfonium salt, and thus an ammonium salt can generate an acid by baking at a low temperature and can cure the film. A decrease of baking temperature prevents the evaporation of acid, leading to an improvement of anti-poisoning effect.

In this connection, there is disclosed a lower layer in which an acid generator of ammonium salt of toluene sulfonic acid has been added (see, for example, Japanese Patent Application Unexamined Publication Nos. 2003-114533 and 2005-331951), nonafluorobutane sulfonate triethylamine salt (see, for example, the specification of Japanese Patent Application Unexamined Publication No. 2002-372829), and nonafluorobutane sulfonate tripropyl amine salt (see, for example, Example of Japanese Patent Application Unexamined Publication No. 2004-28506). Also, a sulfonium salt and an iodonium salt that generate α-difluorosulfonic acid (Japanese Patent Application Unexamined Publication No. 2004-531749), and a sulfonium salt and an iodonium salt that generate α,β-tetrafluorosulfonic acid (Japanese Patent Application Unexamined Publication No. 2004-2252) are proposed.

In order to enhance the poisoning resistance, development of an intermediate layer and a lower layer in which an ammonium salt that can generate a super acid having a high boiling point has been added has been awaited.

SUMMARY OF THE INVENTION

The present invention has been accomplished in view of the above problems. It is an object of the present invention is to provide a material for a resist intermediate layer and/or a lower layer for use in a multilayer resist process such as two-layer resist process and three-layer resist process in which, due to a high boiling point and generation of super acid, a large amount of acid remains in the film even after baking, and thus the function of neutralizing an amine contaminant from the substrate is high, whereby a harmful effect such as trailing skirts of the upper layer resist pattern can be reduced. Also provided is a method for forming a pattern on a substrate by lithography using this material.

The present invention provides a resist lower layer material for forming a lower layer of a chemically amplified multilayer photoresist film, the material comprising:

a crosslinkable polymer; and a thermal acid generator that can generate an acid by heating at 100° C. or greater and is represented by the following general formula (1a):

$$R^1CF_2SO_3^- (R^2)_4N^+ \tag{1a}$$

wherein $R^1$ is a substituted or unsubstituted straight-chain, branched or cyclic $C_1$ to $C_{20}$ alkyl group, which may have —O—, —O—C(=O)—, —C(=O)—, —C(=O)—O—, a hydroxy group, a double bond or a $C_6$ to $C_{20}$ aryl group, and in which one or more hydrogen atoms may be substituted with a fluorine atom, but not all the hydrogen atoms are substituted with fluorine atoms; or a substituted or unsubstituted $C_6$ to $C_{20}$ aryl group in which one or more hydrogen atoms may be substituted with a fluorine atom, but not all the hydrogen atoms are substituted with fluorine atoms; and $R^2$ each independently represents a hydrogen atom; a substituted or unsubstituted straight-chain, branched or cyclic $C_1$ to $C_{10}$ alkyl group, alkenyl group, oxoalkyl group, or alkyl group having a hydroxy group or amino group; a substituted or unsubstituted $C_6$ to $C_{18}$ aryl group, aralkyl group or aryloxoalkyl group; or a group in which at least two of $R^2$ may bond mutually to form a ring together with N in the formula.

The present invention also provides a resist lower layer substrate material comprising a resist lower layer formed on a treatment portion of a substrate using the material The present invention further provides a method for forming a pattern on a substrate by lithography, the method comprising at least steps of: forming a resist lower layer on a treatment portion of the substrate using this resist lower layer material; forming a resist upper layer on the resist lower layer using a photoresist composition so as to obtain a multilayer resist film comprising at least two layers; exposing a pattern circuit region of the multilayer resist film to light; after the exposure, developing the multilayer resist film with a developer to form a resist pattern on the resist upper layer; and etching the resist lower layer and the treatment portion of the substrate using the resist upper layer having the resist pattern formed thereon as a mask so as to form a pattern on the substrate.

In the method for forming a pattern according to a preferred embodiment of the present invention, the step of forming a resist lower layer employs the resist lower layer material in which the crosslinkable polymer comprises a silicon atom, the step of forming a resist upper layer for obtaining a multilayer resist film employs a photoresist composition comprising no silicon atom, and the step of etching for forming a pattern on the substrate comprises etching the lower layer using the upper layer having a photoresist pattern formed thereon as a mask, and subsequently etching the treatment portion of the substrate using the lower layer as a mask so as to form a pattern on the substrate.

In the method for forming a pattern according to another preferred embodiment, the step of forming a resist lower layer employs the resist lower layer material in which the crosslinkable polymer comprises none of a silicon atom, a titanium atom and a germanium atom, but comprises not less than 50% by weight of carbon, the step of forming a resist upper layer for obtaining a multilayer resist film employs a photoresist composition containing a silicon atom, and the step of etching for forming a pattern on the substrate comprises etching the lower layer using the upper layer having a photoresist pattern formed thereon as a mask, and subsequently etching the treatment portion of the substrate using the lower layer as a mask so as to form a pattern on the substrate.

In the method for forming a pattern according to still another preferred embodiment, the step of forming a resist lower layer employs the resist lower layer material in which the crosslinkable polymer comprises none of a silicon atom, a titanium atom and a germanium atom, but comprises not less than 50% by weight of carbon, the step of forming a resist upper layer for obtaining a multilayer resist film comprises forming an intermediate layer comprising a silicon atom on the lower layer, and forming a resist upper layer on the intermediate layer using a photoresist composition containing no silicon atom, and the step of etching for forming a pattern on the substrate comprises dry-etching the intermediate film layer using the upper layer having a photoresist pattern formed thereon as a mask, etching the lower layer using the intermediate film layer as a mask after the photoresist pattern layer is removed, and subsequently etching the treatment portion of the substrate using the lower layer as a mask.

According to a preferred embodiment, the treatment portion of the substrate may be a low dielectric film having a dielectric constant of 3.5 or less or a nitride film.

As described above, the resist lower layer formed using the resist lower layer material of the present invention, when combined with a resist intermediate layer, exhibits an excellent anti-reflection effect, and can reduce a harmful effect on the resist upper layer caused by the amine substance liberated from the substrate. Accordingly, when used as the resist lower layer for three-layer resist process, it is possible to form a pattern on the substrate at a higher precision.

The resist upper layer comprising no silicon atom has an advantage of excellent resolution compared to that comprising a silicon atom. Accordingly, it is possible to form, at a high precision, a pattern to be transferred to the resist intermediate layer, and a pattern to be transferred to the lower layer by dry-etching with mainly an oxygen gas using the resist intermediate layer as a mask. Therefore, an extremely highly precise pattern can be formed by etching the substrate using, as a mask, the resist lower layer to which a pattern has been transferred as described above so as to form a pattern on the substrate.

According to the present invention, the acid generator is added to a resist lower layer material, whereby the acid does not volatize even during baking, and in a resist pattern process, the amine contaminant from the substrate can be neutralized. Therefore, it is possible to reduce a harmful effect such as trailing skirts of the upper layer resist and to form an extremely highly precise pattern.

DETAILED DESCRIPTION OF THE PREFERRED EMBODIMENTS

Figure 1A:
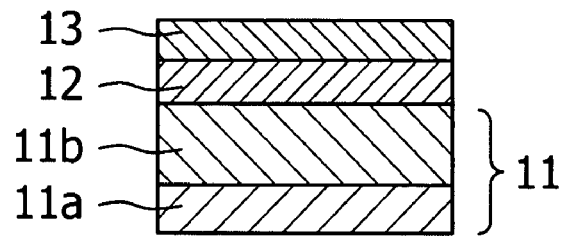
FIGS. 1(a) to 1(e) are diagrams for explaining an example of a method for forming a pattern of the present invention used in two-layer resist process.
Figure 1B:
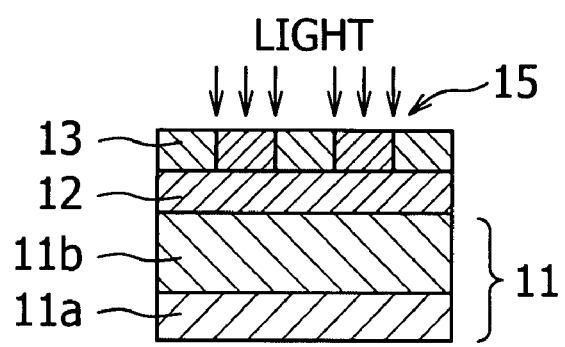
Figure 1C:
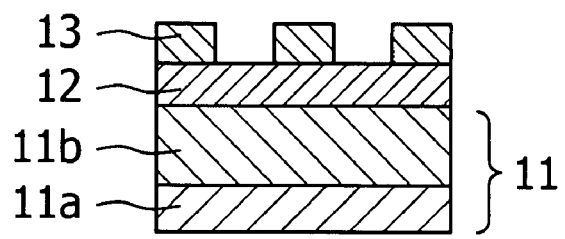

The present invention now will be described more fully hereinafter in which embodiments of the invention are provided with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

Hereinafter, preferred embodiments of the present invention will be described. However, it is to be understood that the present invention is not limited thereto.

As described above, when a porous silica-based low dielectric insulating film is used, an amine substance is adsorped to the pores, and thus the amine substance is liberated from the pores during a resist patterning process, particularly during baking, through the resist lower layer to undergo a neutralization reaction with the acid comprised by the upper layer resist, causing trailing skirts or the like. This causes the problem that it is difficult to form a highly precise resist pattern on the resist upper layer.

In order to solve this problem, the present inventors conducted extensive studies, and they conceived that the addition of a thermal acid generator having a high boiling point and capable of generating a super acid prevents the volatilization of the acid generator caused by baking for cross-linking the resist lower layer, and the contaminant from the porous silica can be neutralized in the resist lower layer. Further, the present inventors examined a thermal acid generator suitable for the resist lower layer material. Thereby, the present invention has been accomplished.

Specifically, the resist lower layer material of the present invention is a resist lower layer material for a multilayer resist film for use in lithography comprising at least a thermal acid generator comprising an amine salt of α-difluorosulfonic acid, that is, a compound represented by the following general formula (1a):

 (1a), wherein

R¹ is a substituted or unsubstituted straight-chain, branched or cyclic alkyl group having 1 to 20 carbon atoms, which may have —O—, —O—C(=O)—, —C(=O)—, —C(=O)—O—, a hydroxy group, a double bond or an aryl group having 6 to 20 carbon atoms, and in which one or more hydrogen atoms may be substituted with a fluorine atom, but not all the hydrogen atoms are substituted with fluorine atoms; or a substituted or unsubstituted aryl group having 6 to 20 carbon atoms in which one or more hydrogen atoms may be substituted with a fluorine, but not all the hydrogen atoms are substituted with fluorine atoms; and R² each independently represents a hydrogen atom; a substituted or unsubstituted straight-chain, branched or cyclic alkyl group having 1 to 10 carbon atoms, a substituted or unsubstituted straight-chain, branched or cyclic alkenyl group having 1 to 10 carbon atoms, a substituted or unsubstituted straight-chain, branched or cyclic oxoalkyl group having 1 to 10 carbon atoms, a substituted or unsubstituted straight-chain, branched or cyclic alkyl group having a hydroxy group or amino group, a substituted or unsubstituted aryl group having 6 to 18 carbon atoms, a substituted or unsubstituted aralkyl group having 6 to 18 carbon atoms, or a substituted or unsubstituted aryloxoalkyl group having 6 to 18 carbon atoms; or at least two of R² may bond mutually to form a ring together with N in the formula.

The resist lower layer material of the present invention and a lower layer substrate produced using this resist lower layer material are novel in which an ammonium salt-based acid generator represented by the above general formula (1a) and capable of generating α-difluorosulfonic acid has been added. This acid generator has an extremely low amount of volatilization even when baked to cross-link the base polymer comprised by the resist lower layer material. For this reason, even if an amine substance is liberated from the substrate during a resist patterning process, the amine substance is neutralized by this acid generator in the resist lower layer. Accordingly, with the use of the resist lower layer material of the present invention, it is possible to reduce a harmful effect such as trailing skirts of the upper layer resist and to form an extremely highly precise pattern.

The α-difluorosulfonic acid is represented by the general formula (2a). In the formula, R¹ is the same as described above.

 (2a)

Specific examples of the anion represented by the formula (2a) may be as follows.

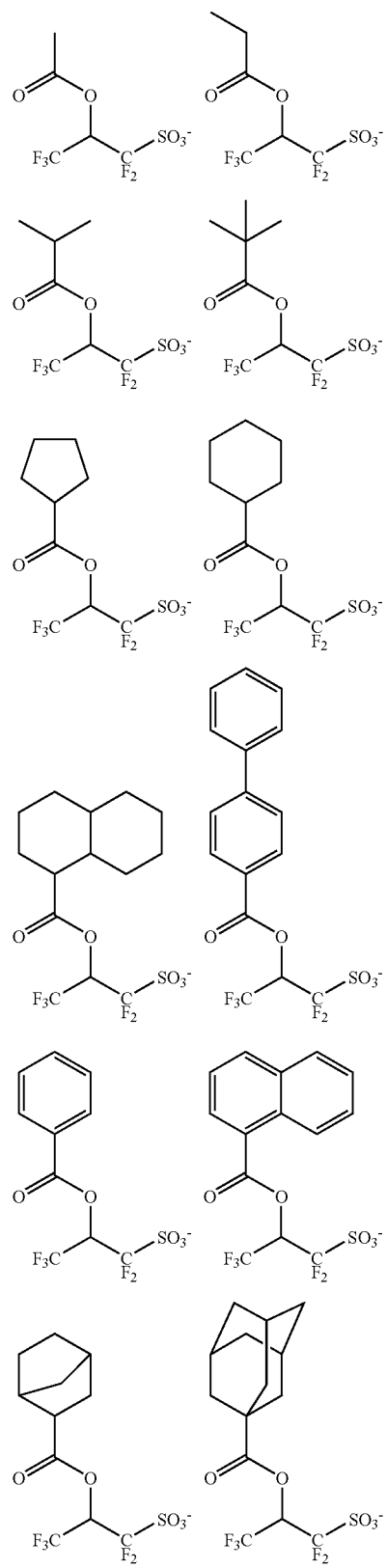

-continued
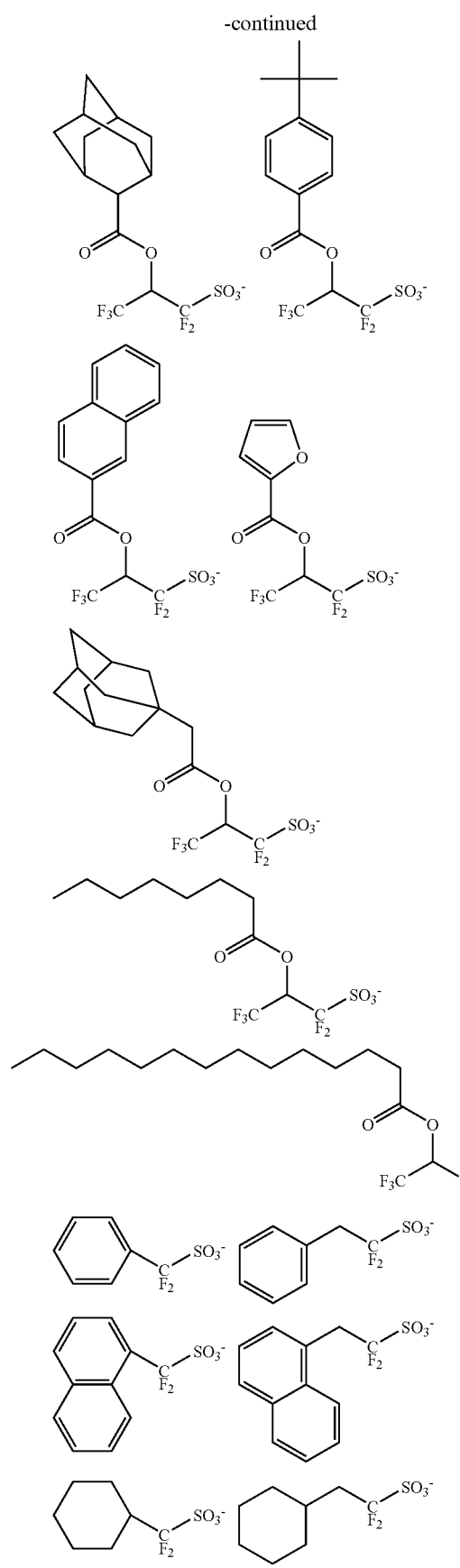
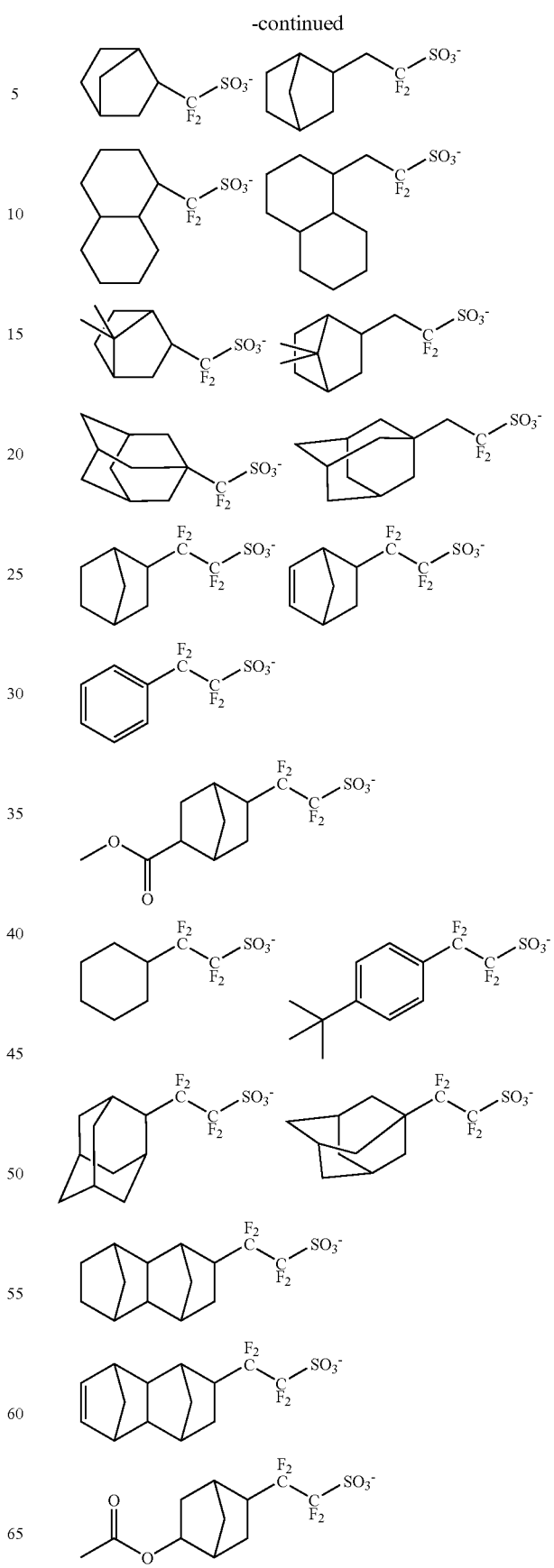

-continued

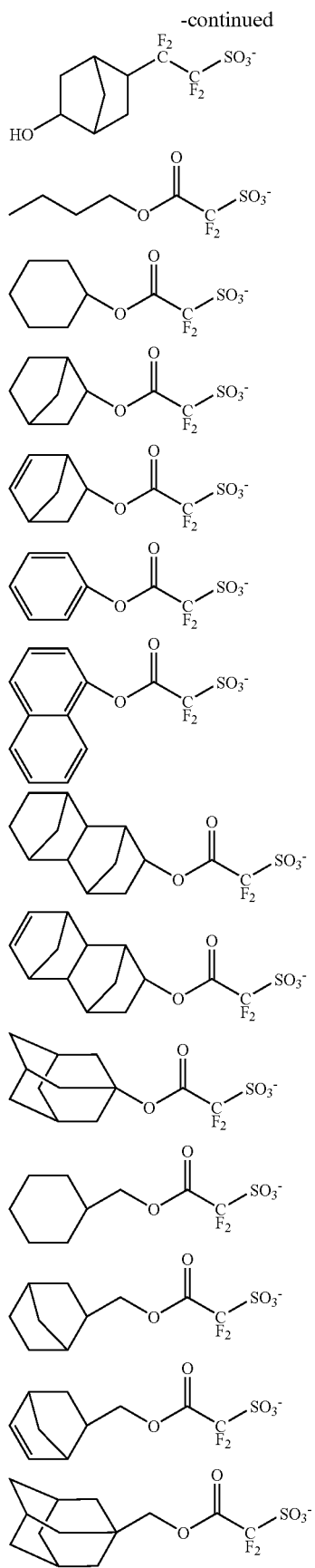

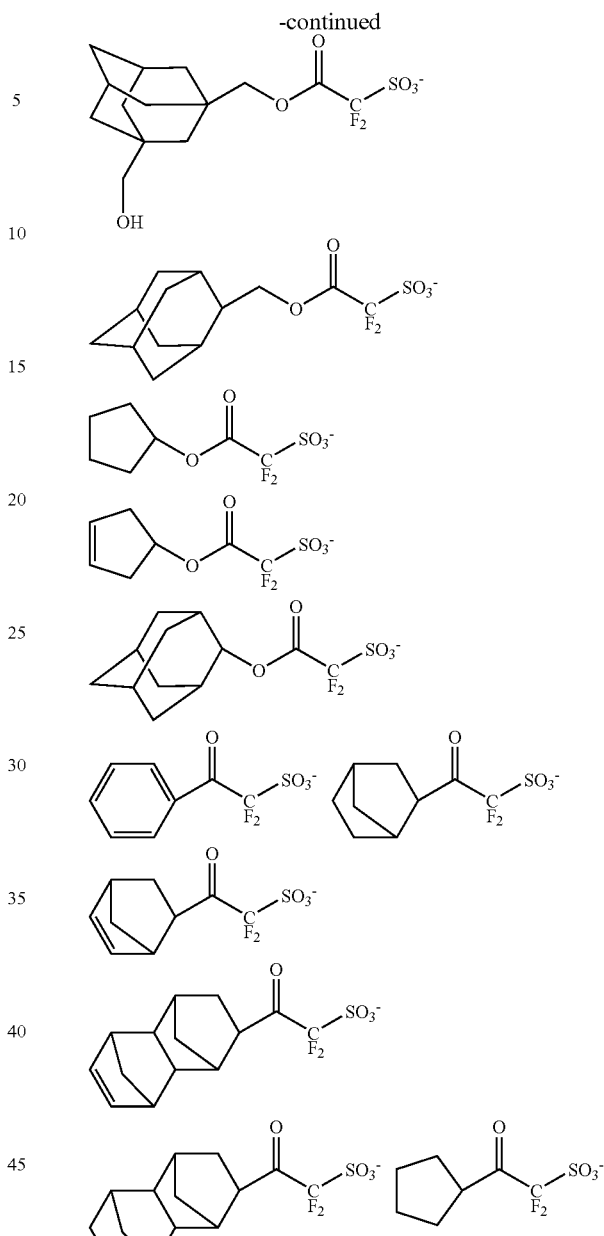

To synthesize the acid generator represented by the above general formula (1a), a method can be used that allows the sulfonic acid of the anion and an ammonium compound (amine compound) to react with each other. The neutralization reaction between the sulfonic acid and the ammonium compound proceeds at room temperature, and may take place in water or an alcohol-based solvent such as methanol, ethanol, isopropanol or isobutanol.

In this case, the amine compound that can form $(R^2)_4N^+$ of the general formula (1a) may include primary, secondary and tertiary aliphatic amines, mixed amines, aromatic amines, heterocyclic amines, nitrogen-containing compounds having a hydroxyl group, nitrogen-containing compounds having a hydroxy phenyl group, alcoholic nitrogen-containing compounds (having an alcohol group, alkoxy group or ester group) and quaternary ammonium.

Specific examples of the primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylene pentamine.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylene pentamine.

Examples of the mixed amines include dimethylethylamine, methylethylpropylamine, benzylamine, phenethylamine, and benzyldimethylamine.

Examples of the aromatic amines and heterocyclic amines include aniline derivatives (e.g., aniline, N-methylaniline, N-ethylaniline, N-propylaniline, N,N-dimethylaniline, di-n-hexylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isoxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazan derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methylpyrrolidone, etc.), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethyl propyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the nitrogen-containing compounds having a hydroxyl group, nitrogen-containing compounds having a hydroxy phenyl group, and alcoholic nitrogen-containing compounds include 2-hydroxy pyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxy ethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, and 1-aziridineethanol.

Examples of the quaternary ammonium hydroxides include tetramethylammonium hydroxide, tetraethylammonium hydroxide, tetrabutylammonium hydroxide, tetrabenzylammonium hydroxide, and trimethylbenzylammonium hydroxide.

Further, it is also possible to use one or more selected from basic compounds represented by the following general formula (B)-1:

$$N(X)_n(O)_{3-n} \qquad (B)\text{-}1,$$

In the formula, n=1, 2 or 3. The side chain X may be the same or different, and can be represented by, for example, the following general formulas (X)-1 to (X)-3. The side chain Y may be the same or different, represents a hydrogen atom or a straight-chain, branched or cyclic alkyl group having 1 to 20 carbon atoms, and may include an ether group or hydroxyl group. Also, Xs may bond together to form a ring.

(X)-1

(X)-2

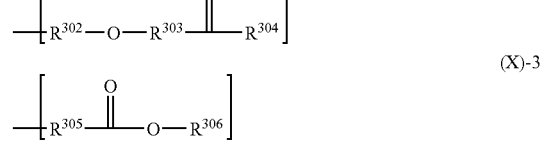

(X)-3 wherein $R^{300}$, $R^{302}$, and $R^{305}$ each is a straight-chain or branched alkylene group having 1 to 4 carbon atoms. $R^{301}$ and $R^{304}$ each is a hydrogen atom, or a straight-chain, branched or cyclic alkyl group having 1 to 20 carbon atoms, and may comprise at least one selected from hydroxy group, ether group, ester group and lactone ring.

$R^{303}$ is a single bond, or a straight-chain or branched alkylene group having 1 to 4 carbon atoms. $R^{306}$ is a straight-chain, branched or cyclic alkyl group having 1 to 20 carbon atoms, and may comprise at least one selected from hydroxy group, ether group, ester group and lactone ring.

Specific examples of the compounds represented by the general formula (B)-1 include but are not limited to: tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyxyethyl)amine, N,N-bis(2-acetoxyethyl)2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)2-(methoxycarbonyl)ethylamine, N,N-bis(2-acetoxyethyl)2-(methoxycarbonyl)ethylamine, N,N-bis(2-hydroxyethyl)2-(ethoxycarbonyl)ethylamine, N,N-bis(2-acetoxyethyl)2-(ethoxycarbonyl)ethylamine, N,N-bis(2-hydroxyethyl)2-(2-methoxyethoxycarbonyl)ethylamine, N,N-bis(2-acetoxyethyl)2-(2-methoxyethoxycarbonyl)ethylamine, N,N-bis(2-hydroxyethyl)2-(2-hydroxyethoxycarbonyl)ethylamine, N,N-bis(2-acetoxyethyl)2-(2-acetoxyethoxycarbonyl)ethylamine, N,N-bis(2-hydroxyethyl)2-[(methoxycarbonyl)methoxycarbonyl]ethylamine, N,N-bis(2-acetoxyethyl)2-[(methoxycarbonyl)methoxycarbonyl]ethylamine, N,N-bis(2-hydroxyethyl)2-(2-oxopropoxycarbonyl)ethylamine, N,N-bis(2-acetoxyethyl)2-(2-oxopropoxycarbonyl)ethylamine, N,N-bis(2-hydroxyethyl)2-(tetrahydrofurfuryloxycarbonyl)ethylamine, N,N-bis(2-acetoxy ethyl)2-(tetrahydrofurfuryloxycarbonyl)ethylamine, N,N-bis(2-hydroxyethyl)2-[(2-oxotetrahydrofuran-3-yl)oxycarbonyl]ethylamine, N,N-bis(2-acetoxyethyl)2-[(2-oxotetrahydrofuran-3-yl)oxycarbonyl]ethylamine, N,N-bis(2-hydroxyethyl)2-(4-hydroxybutoxycarbonyl)ethylamine, N,N-bis(2-formyloxyethyl)2-(4-formyloxybutoxycarbonyl)ethylamine, N,N-bis(2-formyloxyethyl)2-(2-formyloxyethoxycarbonyl)ethylamine, N,N-bis(2-methoxyethyl)2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Further, it is also possible to use one or more selected from basic compounds having a cyclic structure and represented by the following general formula (B)-2:

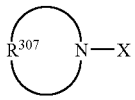

(B)-2 wherein X is the same as described above, and $R^{307}$ is a straight-chain or branched alkylene group having 2 to 20 carbon atoms, and may include at least one selected from a carbonyl group, an ether group, an ester group and sulfide.

Specific examples of the basic compounds having a cyclic structure and represented by the above general formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate; methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate and 2-morpholinoethyl undecanoate.

Further, it is possible to use basic compounds comprising a cyano group and represented by the general formulas (B)-3 to (B)-6.

$$(X)_{\overline{3-n}}-N-(R^{308}-CN)_n \qquad \text{(B)-3}$$

$$R^{307}\!\!\bigcirc\!\!N-R^{308}-CN \qquad \text{(B)-4}$$

$$(X)_{\overline{3-n}}-N-(R^{308}\!\!-\!\!\overset{O}{\underset{\|}{C}}\!\!-\!O-R^{309}-CN)_n \qquad \text{(B)-5}$$

$$R^{307}\!\!\bigcirc\!\!N-R^{308}\!\!-\!\!\overset{O}{\underset{\|}{C}}\!\!-\!O-R^{309}-CN \qquad \text{(B)-6}$$

wherein X, $R^{307}$ and n each has the same definition as described above, and $R^{308}$ and $R^{309}$ each is the same or different and is a straight-chain or branched alkylene group having 1 to 4 carbon atoms.

Specific examples of the basic compounds containing a cyano group include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-cyanoethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

There are two types of acid generators: a photo acid generator and a thermal acid generator. The acid generator represented by the general formula (1a) preferably is a thermal acid generator that generates an acid by heating at 100° C. or greater. The reason why a thermal acid generator that generates an acid by heating at 100° C. or greater is preferable is that both acid generation and cross-linking reaction can take place simultaneously by heating, and no acid is generated during storage at room temperature, in other words, excellent storage stability is obtained.

A preferable amount of the acid generator of the general formula (1a) comprised by the resist lower layer material is 0.1 to 50 parts by weight relative to 100 parts by weight of the polymer (base polymer) comprised by the resist lower layer material. When the amount of the acid generator represented by the general formula (1a) falls within this range, the function of neutralizing the amine contaminant from the substrate is high, and thus the harmful effect such as trailing skirts of the upper layer resist pattern can be reduced. When the amount of the acid generator represented by the general formula (1a) is less than 0.1 parts by weight, the cross-linking in the film may be insufficient, and the resist serving as an upper layer and the intermediate film may be mixed. When the amount of the acid generator represented by the general formula (1a) exceeds 50 parts by weight, a crack may occur in the film.

The base polymer comprised by the resist lower layer material of the present invention preferably includes, but not limited to, a polymer compound that has a hydroxy group, a carboxyl group, or a crosslinkable cyclic ether group such as epoxy or oxetane; preferably comprises a hydrocarbon containing no silicon atom; and preferably has a molecular weight of 1,000 to 100,000.

Specific examples include styrene derivatives, indene, indole, methyleneindane, acenaphthylene, (meta)acryl derivatives, norbornadiene derivatives, norbornene derivatives, maleic anhydride, maleimide derivatives, vinylnaphthalene derivatives, vinylanthracene derivatives, vinylether derivatives, allylether derivatives, and polymers derived from monomers having a polymerizable unsaturated bond such as (meta)acrylonitrile, vinylpyrrolidone and vinylcarbazole. The "(meta)acryl" used herein means methacryl and/or acryl.

Other examples include novolac resins produced by condensation of an aldehyde and the following: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, 1-naphthol, 2-naphthol, 2-methyl-1-naphthol, 4-methoxy-1-naphthol, 7-methoxy-2-naphthol, dihydroxy naphthalene such as 1,5-dihydroxynaphthalene, 1,7-dihydroxynaphthalene and 2,6-dihydroxynaphthalene, methyl 3-hydroxy-naphthalene-2-carboxylate, indene, hydroxyanthracene, acenaphthylene, biphenyl, bisphenol, trisphenol, isothymol, dicyclopentadiene, bicyclo(4,3,0)nona-3,7-diene, 4-vinylcyclohexene, norbornadiene, 5-vinylnorborna-2-ene, α-pinene, β-pinene, limonene, polyindene, polyacenaphthylene, polystyrene, 4,4'-(9H-fluorene-9-ylidene)bisphenol, 2,2'dimethyl-4,4'-(9H-fluorene-9-ylidene)bisphenol, 2,2'diallyl-4,4'-(9H-fluorene-9-ylidene)bisphenol, 2,2'difluoro-4,4'-(9H-fluorene-9-ylidene)bisphenol, 2,2'diphenyl-4,4'-(9H-fluorene-9-ylidene)bisphenol, 2,2'dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, or 5,5'-dimethyl-3,3,3',3'-tetramethyl-2,3,2',3'-tetrahydro-(1,1')-spirobiindene-6,6'-diol.

Note that, for the cocondensation of a phenol with dicyclopentadiene, bicyclo(4,3,0)nona 3,7-diene, 4-vinylcyclohexene, norbornadiene, 5-vinylnorborna-2-ene, α-pinene, β-pinene, limonene or the like, an aldehyde is not necessarily required.

As exemplified above, it is preferable that the base polymer comprised by the resist lower layer material of the present invention comprises no silicon atom, no titanium atom and no germanium atom, but comprises not less than 50% by weight of carbon. When the intermediate film which is located on or above the lower layer comprises a silicon atom, it is preferable that the base polymer comprised by the resist lower layer material comprises no silicon atom, no titanium atom and no germanium atom, so that the selection ratio can be increased in the processing of the lower layer by etching with an oxygen gas or hydrogen gas using the intermediate film as a pattern. Also, because it needs to have a dry-etching resistance in the processing of the substrate, the base polymer preferably comprises not less than 50% by weight of carbon.

The base polymer comprised by the resist lower layer material of the present invention may contain a silicon atom. A specific example is polysilsesquioxane having a crosslinkable group and a light-absorbing group. The amount of the silicon atom preferably is 10 to 50% by weight.

In the present invention, it is preferable that the resist lower layer material further comprises at least one of a cross-linking agent, an acid generator except those represented by the above general formula (1a), and an organic solvent.

One of the properties required for the resist lower layer is no intermixing with the resist upper layer and no diffusion of a low molecule component into the resist upper layer (see, for example, Proc. SPIE Vol. 2195, pp 225 to 229 (1994)). In order to prevent them, usually employed is a method wherein after the formation of a resist lower layer on a substrate by a spin coating method or the like, the resist lower layer is baked for thermal cross-linking. For this reason, when a cross-linking agent is added as a component of the resist lower layer material, a crosslinkable substituent may be introduced into the polymer.

Specific examples of the cross-linking agent usable in the present invention include melamine compounds substituted with at least one group selected from methylol group, alkoxymethyl group and acyloxymethyl group; guanamine compounds; glycoluril compounds or urea compounds; epoxy compounds; isocyanate compounds; azido compounds; and compounds containing a double bond such as an alkenylether group. It may be used as an additive, or may be introduced into a side chain of the polymer as a pendant group. It is also possible to use a compound containing a hydroxy group as a cross-linking agent.

In the above-described specific examples of the cross-linking agent, examples of the epoxy compounds include tris(2,3-epoxypropyl)isocyanurate, trimethylolmethane triglycidylether, trimethylolpropane triglycidylether, triethylolethane triglycidylether, and polymers obtained by glycidyl-etherifying a hydroxy group of the base polymer.

Examples of the melamine compounds include hexamethylol melamine, hexamethoxymethyl melamine, compounds in which 1 to 6 methylol groups of hexamethylol melamine are methoxy-methylated and mixtures thereof, hexamethoxy ethyl melamine, hexaacyloxy methyl melamine, compounds in which 1 to 6 methylol groups of hexamethylol melamine are acyloxy-methylated and mixtures thereof, and the like.

Examples of the guanamine compounds include tetramethylol guanamine, tetramethoxymethyl guanamine, compounds in which 1 to 4 methylol groups of tetramethylol guanamine are methoxy-methylated and mixtures thereof, tetramethoxyethyl guanamine, tetraacyloxy guanamine, compounds in which 1 to 4 methylol groups of tetramethylol guanamine are acyloxy-methylated and mixtures thereof, and the like.

Examples of the glycoluril compounds include tetramethylol glycoluril, tetramethoxy glycoluril, tetramethoxymethyl glycoluril, compounds in which 1 to 4 methylol groups of tetramethylol glycoluril are methoxy-methylated and mixtures thereof, and compounds in which 1 to 4 methylol groups of tetramethylol glycoluril are acyloxy-methylated and mixtures thereof.

Examples of the urea compounds include tetramethylolurea, tetramethoxymethyl urea, compounds in which 1 to 4 methylol groups of tetramethylolurea are methoxy-methylated and mixtures thereof, and tetramethoxyethyl urea.

Examples of the isocyanate compounds include tolylene diisocyanate, diphenylmethane diisocyanate, hexamethylene diisocyanate, and cyclohexane diisocyanate.

Examples of the azide compounds include 1,1'-biphenyl-4,4'-bisazide, 4,4'-methylidene bisazide, and 4,4'-oxybisazide.

Examples of the compounds containing an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

When the polymer comprised by the resist lower layer material of the present invention has epoxy or oxetane as a crosslinkable group, it is effective to add a compound containing a hydroxy group. Particularly, a compound containing two or more hydroxy groups in a molecule is preferable. Examples of the compound containing a hydroxy group include alcohol group-containing compounds such as naphthol novolak, m- and p-cresol novolak, naphthol dicyclopentadiene novolak, m- and p-cresol dicyclopentadiene novolak, 4,8-bis(hydroxymethyl)tricyclo[5.2.1.0$^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]ethylidene]biscyclohexanol, [1,1'-bicyclohexyl]-4,4'-diol, methylene biscyclohexanol and decahydronaphthalene-2,6-diol; and low nuclides of phenol such as [1,1'-bicyclohexyl]-3,3',4,4'-tetrahydroxy, bisphenol, methylenebisphenol, 2,2'-methylene bis[4-methylphenol], 4,4'-methylidene-bis[2,6-dimethylphenol], 4,4'-(1-methylethylidene)bis[2-methylphenol], 4,4'-cyclohexylidene bisphenol, 4,4'-(1,3-dimethylbutylidene)bisphenol, 4,4'-(1-methylethylidene)bis[2,6-di-methylphenol], 4,4'-oxybisphenol, 4,4'-methylene bisphenol, bis(4-hydroxyphenyl)methanone, 4,4'-methylene bis[2-methylphenol], 4,4'-[1,4-phenylene bis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4"-methylidene trisphenol, 4,4'-[1-(4-hydroxyphenyl)-1-methylethyl]phenyl]ethylidene]bis phenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]1,3-benzene diol, 4,4'-[(3,4-dihydroxyphenyl)methylene]bis[2-methylphenol], 4,4',4",4'''-(1,2-ethanediylidene)tetrakisphenol, 4,4',4",4'''-ethanediylidene tetrakis[2-methylphenol], 2,2'-methylene bis[6-[(2-hydroxy-5-methylphenyl)methyl]-4-methylphenol], 4,4',4",4'''-(1,4-phenylenedimethylidyne)tetrakisphenol, 2,4,6-tris(4-hydroxyphenylmethyl)1,3-benzenediol, 2,4',4"-methylidene trisphenol, 4,4',4"-(3-methyl-1-propanyl-3-ylidene)trisphenol, 2,6-bis[(4-hydroxy-3-phlorophenyl)methyl]-4-fluorophenol, 2,6-bis[4-hydroxy-3-fluorophenyl]methyl]-4-fluorophenol, 3,6-bis[(3,5-dimethyl-4-hydroxyphenyl)methyl]1,2-benzenediol, 4,6-bis[(3,5-dimethyl-4-hydroxyphenyl)methyl]1,3-benzenediol, p-methylcalics[4]allene, 2,2'-methylene bis[6-[(2,5/3,6-dimethyl-4/2-hydroxyphenyl)methyl]-4-methylphenol, 2,2'-methylene bis[6-[(3,5-dimethyl-4-hydroxyphenyl)methyl]-4-methylphenol, 4,4',4",4'''-tetrakis[(1-methylethylidene)bis(1,4-cyclohexylidene)]phenol, 6,6'-methylene bis[4-(4- hydroxyphenylmethyl)-1,2,3-benzentriol, and 3,3',5,5'-tetrakis-[(5-methyl-2-hydroxyphenyl)methyl]-[(1,1'-biphenyl)-4,4'-diol].

It is also possible to add a cross-linking agent in which a hydroxy group of the hydroxy-containing compound is substituted with glycidyl ether.

The amount of the cross-linking agent comprised by the resist lower layer material of the present invention preferably is 5 to 50 parts by weight relative to 100 parts by weight of the base polymer (total resin) comprised by the resist lower layer material, and more preferably 10 to 40 parts by weight. When the amount of the cross-linking agent is less than 5 parts by weight, mixing with a resist may occur. When the amount of the cross-linking agent exceeds 50 parts by weight, the antireflection effect may be deteriorated, or a crack may occur in the film after cross-linking.

The resist lower layer material of the present invention is characterized by comprising a thermal acid generator represented by the above general formula (1a), but it is also possible to comprise a conventionally proposed acid generator.

Examples of such monomeric acid generator include
i) onium salts represented by the following general formulas (P1a-1), (P1a-2), (P1a-3) and (P1b),
ii) diazomethane derivatives represented by the following general formula (P2),
iii) glyoxime derivatives represented by the following general formula (P3),
iv) bissulfone derivatives represented by the following general formula (P4),
v) sulfonic acid esters of N-hydroxy imide compounds represented by the following general formula (P5),
vi) β-ketosulfonic acid derivatives,
vii) disulfone derivatives,
viii) nitrobenzyl sulfonate derivatives, and
ix) sulfonic acid ester derivatives.

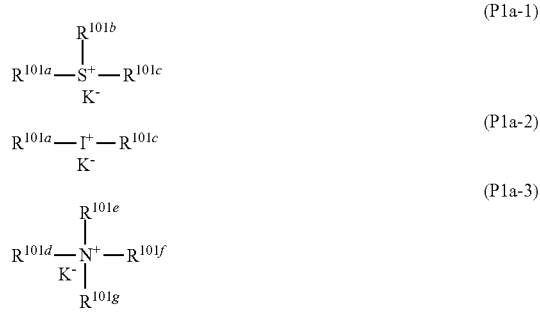

wherein $R^{101a}$, $R^{101b}$, and $R^{101c}$ each independently represents a straight-chain, branched or cyclic alkyl group, alkenyl group, oxoalkyl group or oxoalkenyl group each having 1 to 12 carbon atoms, an aryl group having 6 to 20 carbon atoms, an aralkyl group or aryloxoalkyl group having 7 to 12 carbon atoms. Part or all of hydrogen atoms of these groups may be substituted with an alkoxy group or the like. Further, $R^{101b}$ and $R^{101c}$ may together form a ring. When they form a ring, $R^{101b}$ and $R^{101c}$ represent an alkylene group having 1 to 6 carbon atoms, respectively. $K^-$ represents a non-nucleophilic counter ion. $R^{101d}$, $R^{101e}$, $R^{101f}$ and $R^{101g}$ each represents a hydrogen atom or the same groups as those represented by $R^{101a}$, $R^{101b}$ or $R^{101c}$. $R^{101d}$ and $R^{101e}$, or $R^{101d}$, $R^{101e}$ and $R^{101f}$ may form a ring. $R^{101d}$ and $R^{101e}$ or $R^{101d}$, $R^{101e}$ and $R^{101f}$ may form a ring. When they form a ring, $R^{101d}$, $R^{101e}$, $R^{101d}$, $R^{101e}$ and $R^{101f}$ each represents an alkylene group having 3 to 10 carbon atoms, or a heteroaromatic ring having a nitrogen atom of the above formula in the ring.

The $R^{101a}$, $R^{101b}$, $R^{101c}$, $R^{101d}$, $R^{101e}$, $R^{101f}$, and $R^{101g}$ described above may be the same or different. Specific examples of the alkyl group include methyl group, ethyl group, propyl group, isopropyl group, n-butyl group, sec-butyl group, tert-butyl group, pentyl group, hexyl group, heptyl group, octyl group, cyclopentyl group, cyclohexyl group, cycloheptyl group, cyclopropylmethyl group, 4-methylcyclohexyl group, cyclohexylmethyl group, norbornyl group, and adamantyl group. Examples of the alkenyl group include vinyl group, allyl group, propenyl group, butenyl group, hexenyl group, and cyclohexenyl group. Examples of the oxoalkyl group include 2-oxocyclopentyl group, 2-oxocyclohexyl group, 2-oxopropyl group, 2-cyclopentyl-2-oxoethyl group, 2-cyclohexyl-2-oxoethyl group, and 2-(4-methylcyclohexyl)-2-oxoethyl group. Examples of the oxoalkenyl group include 2-oxo-4-cyclohexenyl group, and 2-oxo-4-propenyl group. Examples of the aryl group include phenyl group, naphthyl group and the like, and alkoxy phenyl group such as p-methoxyphenyl group, m-methoxyphenyl group, o-methoxyphenyl group, ethoxyphenyl group, p-tert-butoxyphenyl group and m-tert-butoxyphenyl group, alkyl phenyl group such as 2-methylphenyl group, 3-methylphenyl group, 4-methylphenyl group, ethylphenyl group, 4-tert-butylphenyl group, 4-butylphenyl group and dimethyl phenyl group, alkyl naphthyl group such as methylnaphthyl group and ethyl naphthyl group, alkoxy naphthyl group such as methoxy naphthyl group and ethoxy naphthyl group, dialkyl naphthyl group such as dimethyl naphthyl group and diethyl naphthyl group, and dialkoxy naphthyl group such as dimethoxy naphthyl group and diethoxy naphthyl group. Examples of the aralkyl group include benzyl group, phenylethyl group, and phenethyl group. Examples of the aryloxoalkyl group include 2-aryl-2-oxoethyl group such as 2-phenyl-2-oxoethyl group, 2-(1-naphthyl)-2-oxoethyl group and 2-(2-naphthyl)-2-oxoethyl group. Examples of the non-nucleophilic counter ion $K^-$ include halide ion such as chloride ion and bromide ion, fluoroalkyl sulfonate such as triflate, 1,1,1-trifluoroethane sulfonate and nonafluorobutane sulfonate, aryl sulfonate such as tosylate, benzene sulfonate, 4-fluorobenzene sulfonate and 1,2,3,4,5-pentafluorobenzene sulfonate, and alkyl sulfonate such as mesylate and butane sulfonate.

Examples of the heteroaromatic ring having the nitrogen atom of the formula in the ring represented by $R^{101d}$, $R^{101e}$, $R^{101f}$ and $R^{101g}$ include imidazole derivatives (e.g., imidazole, 4-methylimidazole, 4-methyl-2-phenylimidazole, etc.), pyrazole derivatives, furazan derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methylpyrrolidone, etc.), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Although (P1a-1) and (P1a-2) have the effect of serving both as a photoacid generator and as a thermal acid generator, (P1a-3) serves only as a thermal acid generator.

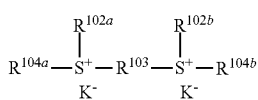
(P1b)

wherein $R^{102a}$ and $R^{102b}$ each independently represents a straight-chain, branched or cyclic alkyl group having 1 to 8 carbon atoms. $R^{103}$ represents a straight-chain, branched or cyclic alkylene group having 1 to 10 carbon atoms. $R^{104a}$ and $R^{104b}$ each independently represents a 2-oxoalkyl group having 3 to 7 carbon atoms. $K^-$ represents a non-nucleophilic counter ion.

Specific examples of the alkyl group of $R^{102a}$ and $R^{102b}$ include methyl group, ethyl group, propyl group, isopropyl group, n-butyl group, sec-butyl group, tert-butyl group, pentyl group, hexyl group, heptyl group, octyl group, cyclopentyl group, cyclohexyl group, cyclopropylmethyl group, 4-methylcyclohexyl group, and cyclohexyl methyl group. Examples of the alkylene group of $R^{103}$ include methylene group, ethylene group, propylene group, butylene group, pentylene group, hexylene group, heptylene group, octylene group, nonylene group, 1,4-cyclohexylene group, 1,2-cyclohexylene group, 1,3-cyclopentylene group, 1,4-cyclooctylene group, and 1,4-cyclohexane dimethylene group. Examples of the 2-oxoalkyl group of $R^{104a}$ and $R^{104b}$ include 2-oxopropyl group, 2-oxocyclopentyl group, 2-oxocyclohexyl group, and 2-oxocycloheptyl group. Examples of the $K^-$ are the same as those listed for the formulas (P1a-1), (P1a-2) and (P1a-3)

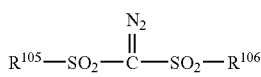
(P2)

wherein $R^{105}$ and $R^{106}$ each represents a straight-chain, branched or cyclic alkyl group or halogenated alkyl group having 1 to 12 carbon atoms, an aryl group or halogenated aryl group having 6 to 20 carbon atoms, or an aralkyl group having 7 to 12 carbon atoms.

Examples of the alkyl group of $R^{105}$ and $R^{106}$ include methyl group, ethyl group, propyl group, isopropyl group, n-butyl group, sec-butyl group, tert-butyl group, pentyl group, hexyl group, heptyl group, octyl group, amyl group, cyclopentyl group, cyclohexyl group, cycloheptyl group, norbornyl group, and adamantyl group. Examples of the halogenated alkyl group include trifluoromethyl group, 1,1,1-trifluoroethyl group, 1,1,1-trichloroethyl group, and nonafluorobutyl group. Examples of the aryl group include alkoxyphenyl group such as phenyl group, p-methoxyphenyl group, m-methoxyphenyl group, o-methoxyphenyl group, ethoxyphenyl group, p-tert-butoxyphenyl group and m-tert-butoxyphenyl group, and alkylphenyl group such as 2-methylphenyl group, 3-methylphenyl group, 4-methylphenyl group, ethylphenyl group, 4-tert-butylphenyl group, 4-butylphenyl group and dimethylphenyl group. Examples of the halogenated aryl group include fluorophenyl group, chlorophenyl group and 1,2,3,4,5-pentafluorophenyl group. Examples of the aralkyl group include benzyl group and phenethyl group.

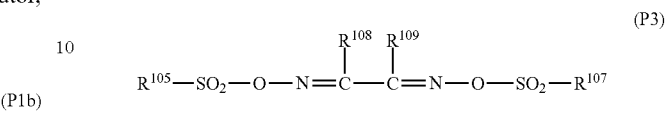
(P3)

wherein $R^{107}$, $R^{108}$ and $R^{109}$ each independently represents a straight-chain, branched, cyclic alkyl group or halogenated alkyl group having 1 to 12 carbon atoms, an aryl group or halogenated aryl group having 6 to 20 carbon atoms, or an aralkyl group having 7 to 12 carbon atoms; $R^{108}$ and $R^{109}$ may bond together to form a cyclic structure, and when they form a cyclic structure, $R^{108}$ and $R^{109}$ each independently represents a straight-chain or branched alkylene group having 1 to 6 carbon atoms; and $R^{105}$ represents the same that as described in the formula (P2).

Examples of the alkyl group, halogenated alkyl group, aryl group, halogenated aryl group and aralkyl group of $R^{107}$, $R^{108}$ and $R^{109}$ include those listed for $R^{105}$ and $R^{106}$. Examples of the alkylene group of $R^{108}$ and $R^{109}$ include methylene group, ethylene group, propylene group, butylene group and hexylene group.

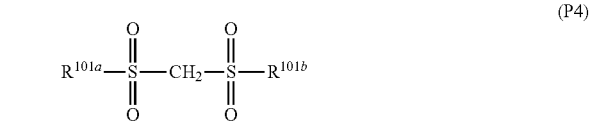
(P4)

wherein $R^{101a}$ and $R^{101b}$ are the same as those described above.

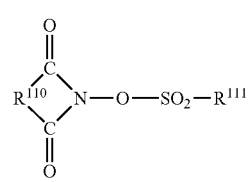
(P5)

wherein $R^{110}$ represents an arylene group having 6 to 10 carbon atoms, an alkylene group having 1 to 6 carbon atoms, or an alkenylene group having 2 to 6 carbon atoms, and part or all of hydrogen atoms of these groups may be further substituted with a straight-chain or branched alkyl group or alkoxy group, nitro group, acetyl group, or phenyl group having 1 to 4 carbon atoms; and $R^{111}$ represents a straight-chain, branched or substituted alkyl group, alkenyl group or alkoxyalkyl group having 1 to 8 carbon atoms, a phenyl group or a naphthyl group, and part or all of hydrogen atoms of these groups may be substituted with an alkyl group or alkoxy group having 1 to 4 carbon atoms, a phenyl group which may be substituted with an alkyl group, alkoxy group, nitro group or acetyl group having 1 to 4 carbon atoms, a heteroaromatic group having 3 to 5 carbon atoms, a chlorine atom or a fluorine atom.

Examples of the arylene group of $R^{110}$ include 1,2-phenylene group and 1,8-naphtylene group. Examples of the alkylene group include methylene group, ethylene group, trimethylene group, tetramethylene group, phenylethylene group and norbornane-2,3-di-yl group. Examples of the alkenylene group include 1,2-vinylene group, 1-phenyl-1,2-vinylene group and 5-norbornene-2,3-di-yl group. Examples of the alkyl group of $R^{111}$ include those listed for $R^{101a}$ to $R^{101c}$. Examples of the alkenyl group of $R^{111}$ include vinyl group, 1-propenyl group, allyl group, 1-butenyl group, 3-butenyl group, isoprenyl group, 1-pentenyl group, 3-pentenyl group, 4-pentenyl group, dimethylallyl group, 1-hexenyl group, 3-hexenyl group, 5-hexenyl group, 1-heptenyl group, 3-heptenyl group, 6-heptenyl group, and 7-octenyl group. Examples of the alkoxyalkyl group include methoxymethyl group, ethoxymethyl group, propoxymethyl group, butoxymethyl group, pentyloxymethyl group, hexyloxymethyl group, heptyloxymethyl group, methoxyethyl group, ethoxyethyl group, propoxyethyl group, butoxyethyl group, pentyloxyethyl group, hexyloxyethyl group, methoxypropyl group, ethoxypropyl group, propoxypropyl group, butoxypropyl group, methoxybutyl group, ethoxybutyl group, proppxybutyl group, methoxypentyl group, ethoxypentyl group, methoxyhexyl group and methoxyheptyl group.

Examples of the alkyl group having 1 to 4 carbon atoms which may be further substituted include methyl group, ethyl group, propyl group, isopropyl group, n-butyl group, isobutyl group, and tert-butyl group. Examples of the alkoxy group having 1 to 4 carbon atoms include methoxy group, ethoxy group, propoxy group, isopropoxy group, n-butoxy group, isobutoxy group and tert-butoxy group. Examples of the phenyl group which may be substituted with an alkyl group, alkoxy group, nitro group or acetyl group having 1 to 4 carbon atoms include phenyl group, tolyl group, p-tert-butoxyphenyl group, p-acetylphenyl group and p-nitrophenyl group. Examples of the heteroaromatic group having 3 to 5 carbon atoms include pyridyl group and furil group.

As for the monomeric acid generator, Specific examples of the onium salts include tetramethylammonium trifluoromethanesulfonate, tetramethylammonium nonafluorobutanesulfonate, triethylammonium nonafluorobutanesulfonate, pyridinium nonafluorobutanesulfonate, triethylammonium camphorsulfonate, pyridinium camphorsulfonate, tetra n-butylammonium nonafluorobutanesulfonate, tetraphenylammonium nonafluorobutanesulfonate, tetramethylammonium p-toluenesulfonate, diphenyliodoniumtrifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfoniumbutanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, (2-norbonyl)methyl(2-oxocyclohexyl)sulfonium trifluoromethanesulfonate, ethylene bis[methyl(2-oxocyclopentyl)sulfonium trifluoromethanesulfonate] and 1,2'-naphthylcarbonylmethyl-tetrahydro thiophenium triflate.

Examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoro ethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime and bis-O-(camphorsulfonyl)-α-dimethylglyoxime.

Examples of the bissulfone derivatives include bisnaphthylsulfonyl methane, bis-trifluoromethylsulfonyl methane, bismethylsulfonyl methane, bisethylsulfonyl methane, bispropylsulfonyl methane, bisisopropylsulfonyl methane, bis-p-toluenesulfonyl methane and bisbenzenesulfonyl methane.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone derivatives, and diyclohexyl disulfone derivatives.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesulfonyloxy)benzene and 1,2,3-tris(p-toluenesulfonyloxy)benzene.

Examples of the sulfonic acid ester derivatives of N-hydroxy imide compounds include N-hydroxysuccinimide methane sulfonic acid ester, N-hydroxysuccinimide trifluoromethane sulfonic acid ester, N-hydroxysuccinimide ethane sulfonic acid ester, N-hydroxysuccinimide 1-propane sulfonic acid ester, N-hydroxysuccinimide 2-propane sulfonic acid ester, N-hydroxysuccinimide 1-pentane sulfonic acid ester, N-hydroxysuccinimide 1-octane sulfonic acid ester, N-hydroxysuccinimide p-toluene sulfonic acid ester, N-hydroxysuccinimide p-methoxybenzene sulfonic acid ester, N-hydroxysuccinimide 2-chloroethane sulfonic acid ester, N-hydroxysuccinimide benzene sulfonic acid ester, N-hydroxysuccinimide-2,4,6-trimethylbenzene sulfonic acid ester, N-hydroxysuccinimide 1-naphthalene sulfonic acid ester, N-hydroxysuccinimide 2-naphthalene sulfonic acid ester, N-hydroxy-2-phenylsuccinimide methane sulfonic acid ester, N-hydroxymaleimide methane sulfonic acid ester, N-hydroxymaleimide ethane sulfonic acid ester, N-hydroxy-2-phenylmaleimide methane sulfonic acid ester, N-hydroxyglutarimide methane sulfonic acid ester, N-hydroxyglutarimide benzene sulfonic acid ester, N-hydroxyphthalimide methane sulfonic acid ester, N-hydroxyphthalimide benzene sulfonic acid ester, N-hydroxyphthalimide trifluoromethane sulfonic acid ester, N-hydroxyphthalimide p-toluene sulfonic acid ester, N-hydroxynaphthalimide methane sulfonic acid ester, N-hydroxynaphthalimide benzene sulfonic acid ester, N-hydroxy-5-norbornene-2,3-dicarboxyimido methane sulfonic acid ester, N-hydroxy-5-norbornene-2,3-dicarboxyimido trifluoromethane sulfonic acid ester and N-hydroxy-5-norbornene-2,3-dicarboxyimido p-toluene sulfonic acid ester.

Particularly preferable examples include: onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbonyl)methyl(2-oxocyclohexyl)sulfonium trifluoromethanesulfonate and 1,2'-naphthylcarbonylmethyltetrahydro thiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane and bis(tert-butylsulfonyl)diazomethane; glyoxime derivatives such as bis-O-(p-toluenesulfonyl)-α-dimethylglyoxime and bis-O-(n-butanesulfonyl)-α-dimethyl glyoxime; bissulfone derivatives such as bisnaphthylsulfonyl methane; and sulfonic acid ester derivatives of N-hydroxy imide compounds such as N-hydroxysuccinimide methane sulfonic acid ester, N-hydroxysuccinimide trifluoromethane sulfonic acid ester, N-hydroxysuccinimide 1-propane sulfonic acid ester, N-hydroxysuccinimide 2-propane sulfonic acid ester, N-hydroxysuccinimide 1-pentane sulfonic acid ester, N-hydroxysuccinimide p-toluene sulfonic acid ester, N-hydroxynaphthalimide methane sulfonic acid ester and N-hydroxynaphthalimide benzene sulfonic acid ester.

The acid generators except those represented by the general formula (1a) comprised by the resist lower layer material are optional, and the acid generators listed above can be used alone or in combination of two or more.

The resist lower layer material of the present invention may further contain a basic compound for improving storage stability.

The basic compound serves as an acid quencher to prevent a trace amount of acid generated from the acid generator during storage from facilitating a cross-linking reaction.

Examples of the basic compound include primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives and imide derivatives.

Specific examples of the primary aliphatic amines include ammonia, methylamine, ethylamine, n-propylamine, isopropylamine, n-butylamine, isobutyl amine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine and tetraethylene pentamine.

Examples of the secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl methylenediamine, N,N-dimethyl ethylenediamine and N,N-dimethyl tetraethylenepentamine.

Examples of the tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethyl methylenediamine, N,N,N',N'-tetramethyl ethylenediamine and N,N,N',N'-tetramethyl tetraethylenepentamine.

Examples of the mixed amines include dimethylethylamine, methylethylpropylamine, benzylamine, phenethylamine and benzyldimethylamine.

Examples of the aromatic amines and the heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isoxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazan derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methylpyrolidone, etc.), imidazoline derivatives, imidazolidine derivatives, pyridine derivatives (e.g., pyridine, methylpyridine, ethylpyridine, propylpyridine, butylpyridine, 4-(1-butyl pentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Examples of the nitrogen-containing compounds having a carboxy group include aminobenzoic acid, indole carboxylic acid and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine).

Examples of the nitrogen-containing compounds having a sulfonyl group include 3-pyridine sulfonic acid and pyridinium p-toluenesulfonate.

Examples of the nitrogen-containing compounds having a hydroxyl group, the nitrogen-containing compounds having a hydroxyphenyl group, and the alcoholic nitrogen-containing compounds include 2-hydroxypyridine, aminocresol, 2,4-quinolinediol, 3-indole methanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl) isonicotinamide.

Examples of the amide derivatives include formamide, N-methylformamide, N,N-dimethylformamide, acetamide, N-methylacetamide, N,N-dimethylacetamide, propioneamide and benzamide.

Examples of the imido derivatives include phthalimide, succinimide and maleimide.

The amount of the basic compound comprised by the resist lower layer material is preferably 0.001 to 2 parts by weight, more preferably 0.01 to 1 parts by weight relative to 100 parts by weight of the total base polymer comprised by the resist lower layer material. When the amount of the basic compound is less than 0.001 parts by weight, the effect obtained by adding the basic compound may be small. When the amount of the basic compound exceeds 2 parts by weight, all the acid generated by heat may be trapped, and cross-linking may not occur.

The organic solvent usable in the resist lower layer material of the present invention is not specifically limited as long as the above-described base polymer, the acid generator, the cross-linking agent, other additives and the like can be dissolved. Specific examples include: ketones such as cyclohexanone and methyl-2-amyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol monomethyl ether acetate and propylene glycol mono-tert-butyl ether acetate. They can be used alone or in combination of two or more. However, the organic solvent is not limited thereto. Among the organic solvents listed above, diethylene glycol dimethyl ether, 1-ethoxy-2-propanol, ethyl lactate, propylene glycol monomethyl ether acetate, cyclohexanone, and mixed solvents thereof are preferably used in the resist lower layer material of the present invention.

The amount of the organic solvent comprised by the resist lower layer material is preferably is 200 to 10,000 parts by weight, more preferably 300 to 5,000 parts by weight relative to 100 parts of the total base polymer comprised by the resist lower layer material.

The present invention further provides a method for forming a pattern on a substrate by lithography, the method comprising at least the steps of: forming a resist lower layer on the substrate using the resist lower layer material of the present invention; forming a resist upper layer comprising a photoresist composition on the lower layer to form a two-layer resist film; exposing a pattern circuit region of the two-layer resist film to light; subsequently developing the two-layer resist film with a developer to form a resist pattern on the resist upper layer etching the resist lower layer using the resist upper layer having a pattern formed thereon as a mask; and etching the substrate using the resist lower layer having at least a pattern formed thereon as a mask to form a pattern on the substrate.

The above two-layer resist process will be described with reference to FIG. 1.

A resist lower layer 12 of the present invention can be formed, similarly to the case of using a photoresist composition, on a substrate 11 by a spin coating method or the like. After the resist lower layer 12 is formed by the spin coating method or the like, it is preferable to evaporate the organic solvent and then bake the resist lower layer 12 for the purpose of facilitating a cross-linking reaction in order to prevent mixing with a resist upper layer 13. The baking is preferably performed at a temperature of 80 to 400° C. for 10 to 300 seconds. Although the thickness of this resist lower layer 12 can be appropriately selected, the thickness is preferably 50 to 20,000 nm, more preferably 100 to 15,000 nm. After the resist lower layer 12 is formed, a resist upper layer 13 is formed on the resist lower layer 12 (see FIG. 1(a)).

In the two-layer resist process, as the photoresist composition for forming the resist upper layer 13, when the polymer comprised by the resist lower layer comprises no silicon atom, no titanium atom and no germanium atom, a composition comprising a silicon atom preferably can be used. Conversely, when the polymer comprised by the resist lower layer comprises a silicon atom, a composition containing no silicon atom preferably can be used as the resist upper layer composition. In other words, by allowing either one of the resist lower layer composition and the resist upper layer composition to comprise a silicon atom, the selection ratio of etching can be increased.

As the silicon-containing resist for two-layer resist process, in terms of resistance to etching using an oxygen gas, it is preferable to use a photoresist composition such as a positive photoresist composition comprising a silicon atom-containing polymer such as a polysilsesquioxane derivative, a vinylsilane derivative, a polyhedral oligosilsesquioxane (POSS) pendant (meta)acrylate as a base polymer, an organic solvent, an acid generator, and an optional basic compound or the like. They are not particularly limited, and any known ones can be used.

Examples of the resist upper layer composition for two-layer resist process that does not comprise silicon include compositions comprising hydroxystyrene, (meta)acrylate, norbornene-maleic anhydride copolymer, polynorbornene or a metathesis ring-opening polymer.

When forming the resist upper layer 13 using the above photoresist composition, similarly to the case of forming the resist lower layer 12, a spin coating method may be preferably used. After the resist upper layer 13 is formed by a spin coating method or the like, pre-baking may be performed. The pre-baking may be preferably performed at a temperature of 80 to 180° C. for 10 to 300 seconds. Thereafter, according to an ordinary method, a pattern circuit region 15 of the two-layer resist film may be exposed to light (see FIG. 1(b)), followed by post exposure baking (PEB) preferably at 50 to 150° C., and development to obtain a resist pattern (see FIG. 1(c)).

The thickness of the resist upper layer 13 is, but not limited to, preferably 30 to 500 nm, more preferably 50 to 400 nm.

As the exposure light, a high energy ray having a wavelength of 300 nm or less, specifically, an excimer laser having a wavelength of 248, 193 or 157 nm, a soft X-ray having a wavelength of 3 to 20 nm, an electron beam, an X-ray or the like can be used.

As the development, a puddle method or dip method using an alkali aqueous solution or the like is used. Particularly, it is preferable to employ the puddle method using an aqueous solution of 2.38% by weight tetramethylammonium hydroxide and to perform the method preferably at room temperature for 10 to 300 seconds, followed by rinsing with pure water and drying using a method such as spin drying or nitrogen blowing.

Subsequently, using the obtained resist pattern as a mask, etching is performed.

Figure 1D:
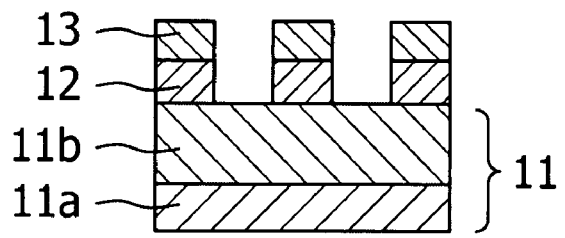
Figure 1E:
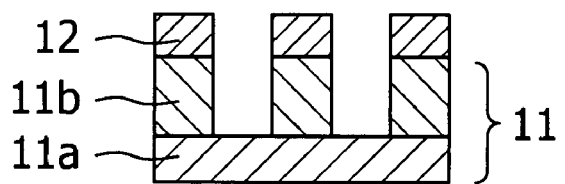

The etching of the resist lower layer 12 in the two-layer resist process is performed by dry-etching using mainly an oxygen gas or the like (see FIG. 1(d)). In the case of dry-etching using mainly an oxygen gas, in addition to the oxygen gas, it is also possible to use an additional gas such as an inert gas (e.g. He or Ar), CO, $CO_2$, $NH_3$, $SO_2$, $N_2$, or $NO_2$. Particularly, the additional gases are used to protect the side wall so as to prevent the undercutting of the sidewall of the pattern. It is also possible to use a hydrogen gas instead of an oxygen gas.

The subsequent etching of the substrate 11 also can be performed by an ordinary method. For example, when the substrate comprises a low dielectric insulating film of $SiO_2$, SiN, SiON, porous silica or the like, or an etching stopper film thereof, etching can be performed using mainly a fluorocarbon-based gas. When the substrate comprises polysilicone (p-Si), Al or W, etching can be performed using mainly a chlorine-based or bromine-based gas (FIG. 1(e)).

When the substrate is etched using a fluorocarbon-based gas, separation of the silicon-containing resist for the two-layer resist process can be performed concurrently with the processing of the substrate.

When the substrate is etched using a chlorine-based or bromine-based gas, after the processing of the substrate, it is necessary to separately perform the separation of the silicon-containing resist by dry-etching using a fluorocarbon-based gas.

As shown in FIG. 1, the substrate 11 can be divided into a treatment portion 11b to be etched and a base portion 11a not to be etched. The treatment portion may be a part of the substrate made of $SiO_2$, SiN, SiON or the like, or a low dielectric insulating film such as a porous silica film formed on the substrate as a part of the substrate. To prevent the electric leakage between wirings, the treatment portion preferably is a low dielectric film having a dielectric constant of 3.5 or less or a nitride film. The low dielectric film having a dielectric constant of 3.5 or less may include silica having pores (porous silica). The dielectric constant can be measured by a static capacitance method, a probe method or the like. Patricianly, it is preferable to employ mercury probe method. The measurement method is described in Japanese Patent Application Unexamined Publication No. 2006-117763 (see paragraph [0081]).

The thickness of the treatment portion can be selected considering the conditions for etching or the like and preferable thickness may be 0.1 to 10 μm.

The present invention further provides a method for forming a pattern on a substrate by lithography, the method comprising at least the steps of: forming a resist lower layer on the substrate using the resist lower layer material of the present invention; forming a silicon-atom-containing resist intermediate layer on the lower layer; forming a resist upper layer made of a photoresist composition on the intermediate layer to form a three-layer resist film; exposing a pattern circuit region of the resist three-layer to light; subsequently developing the resist three-layer with a developer to form a resist pattern on the resist upper layer; etching the resist intermediate layer using the resist upper layer having a pattern formed thereon as a mask; etching the resist lower layer using the resist intermediate layer having at least a pattern formed thereon as a mask; and etching the substrate using the resist lower layer having at least a pattern formed thereon as a mask to form a pattern on the substrate.

The three-layer resist process will be described with reference to FIG. 2.

First, in the same manner as in the two-layer resist process described above, a resist lower layer 22 is formed on a substrate 21.

Subsequently, in the three-layer resist process, preferably, a lower layer 22 comprising no silicon atom, no titanium atom or no germanium atom is formed. On the lower layer 22, a silicon-containing resist intermediate layer 24 is formed, and on the intermediate layer 24, a monolayer resist layer (resist upper layer 23) comprising no silicon is formed (see FIG. 2(a)).

As the resist lower layer 22 for the three-layer resist process, preferably, a resist lower layer similar to the resist lower layer for the two-layer resist lower layer comprising no silicon atom, no titanium atom and no germanium atom can be used. A preferred thickness of the resist lower layer for the three-layer resist process is the same as that of the resist lower layer for the two-layer resist process.

As the silicon-containing resist intermediate layer 24 for the three-layer resist process, in terms of resistance to etching using an oxygen gas, it is preferable to use a silicon atom-containing polymer such as polyhedral oligosilsesquioxane (POSS) or polysilsesquioxane derivative having a crosslinkable group as a base polymer, and to add an organic solvent, an acid generator and an optional cross-linking agent and the like. As specific compositions of the resist intermediate film, conventional compositions as described in Japanese Patent Application Unexamined Publication No. 2004-310019 can be used.

The resist intermediate layer 24 can be usually formed by, similarly to the lower layer, a spin coating method and baking preferably at 50 to 150° C. to cause cross-linking. The thickness of the resist intermediate layer 24 can be selected appropriately, but the thickness may be in the range preferably from 10 to 1,000 nm, more preferably from 20 to 500 nm.

As the photoresist composition for forming the resist upper layer 23 for the three-layer resist process, it is preferable to use a commonly used and known composition comprising a hydrocarbon and containing no silicon atom. The thickness of the resist upper layer 23 is not particularly limited, but the thickness may be in the range preferably from 30 to 500 nm, more preferably from 50 to 400 nm.

Figure 2A:
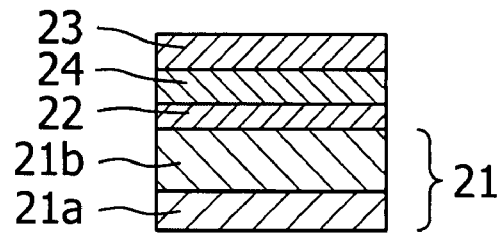
FIGS. 2(a) to 2(f) are diagrams for explaining an example of a method for forming a pattern of the present invention used in three-layer resist process.
Figure 2B:
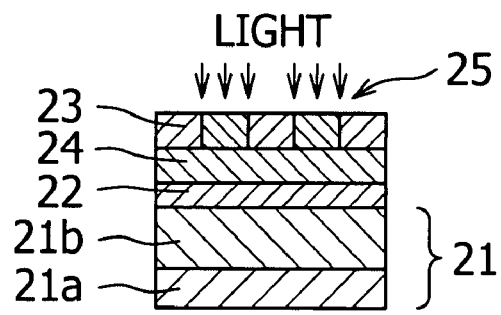
Figure 2C:
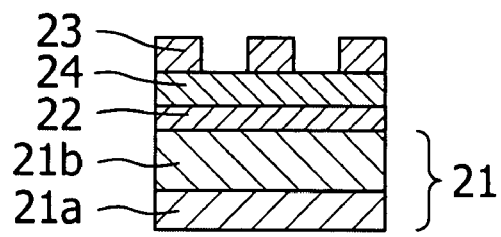

After the formation of the resist upper layer, according to an ordinary method, a pattern circuit region 25 of the three-layer resist film is exposed to light (see FIG. 2(b)), followed by preferable post exposure baking (PEB) at 60 to 150° C., and development to obtain a resist pattern on the resist upper layer (see FIG. 2(c)).

Then, etching can be performed using the obtained resist pattern as a mask.

Figure 2D:
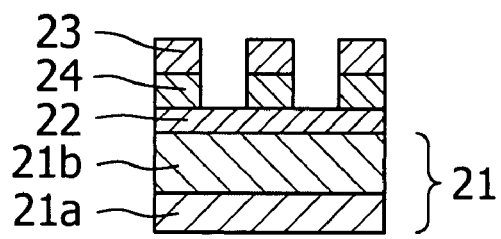
Figure 2E:
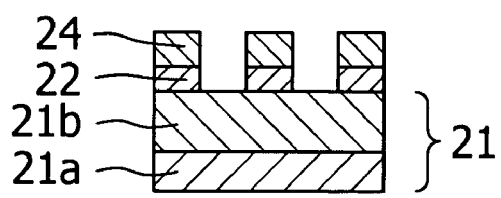
Figure 2F:
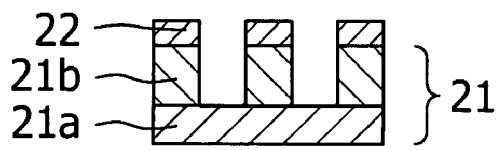

The etching of the resist intermediate layer 24 in the three-layer resist process can be performed using a fluorocarbon-based gas or the like, and the resist pattern as a mask (see FIG. 2(d)). Subsequently, similarly to the two-layer resist process, dry-etching can be performed using mainly an oxygen gas. Using a pattern transferred to the resist intermediate layer 24 as a mask, the resist lower layer 22 is processed (see FIG. 2E).

The subsequent etching of the substrate 21 also can be performed by an ordinary method. For example, when the substrate comprises a low dielectric insulating film of $SiO_2$, SiN, SiON, porous silica or the like, etching can be performed using mainly a fluorocarbon-based gas. When the substrate 21 comprise polysilicone (p-Si), Al or W, etching can be performed using mainly a chlorine-based or bromine-based gas (see FIG. 2(f)).

As shown in FIG. 2, the substrate 21 can be divided into a treatment portion 21b to be etched and a base portion 21a not to be etched. The treatment portion may be a part of the substrate such as $SiO_2$, SiN and SiON substrates, or may be a low dielectric insulating film such as a porous silica film formed on the substrate as a part of the substrate. Considering prevention of the electric leakage between wirings, the treatment portion may be preferably a low dielectric film having a dielectric constant of 3.5 or less or a nitride film. The low dielectric film having a dielectric constant of 3.5 or less may include silica having pores (porous silica).

The thickness of the treatment portion can be selected considering the conditions for etching and the like. The thickness may be preferably 0.1 to 10 μm.

The foregoing discusses the two-layer resist process and the three-layer resist process. As for a resist comprising four layers or more, for example, the uppermost layer is a conventional resist, the next layer is a conventional anti-reflection film, the next layer is a silicon-containing intermediate layer, and the lowermost layer is an organic film containing no silicon. In this case, the material of the present invention can be used for the intermediate layer and the lower layer.

Hereinafter, the present invention will be described specifically with reference to Synthesis Examples, Comparative Synthesis Examples, Examples and Comparative Examples. It should not be construed that the present invention is limited to Examples.

Synthesis of Thermal Acid Generator

Synthesis Example 1

Synthesis of triethylammonium 1,1,3,3,3-pentafluoro-2-(pivaloyloxy)propane sulfonate (TAG1)

Triethylamine was dissolved in cold water, and hydrochloric acid was added thereto to adjust the pH of the reaction liquid to fall within a range of 1 to 3. Then sodium 1,1,3,3,3-pentafluoro-2-(pivaloyloxy)propanesulfonate and dichloromethane were added thereto and stirred. The separated organic layer was washed with water, and dichloromethane was removed under reduced pressure from the washed organic layer. To the residue thus obtained, diethyl ether was added for recrystallization. The resultant was filtrated and dried to obtain a desired product at a yield of 75%. The structure of the obtained product was identified using $^1$H-NMR, IR and TOFMS spectra.

Synthesis Example 2

Synthesis of tetrabutylammonium 1,1,3,3,3-pentafluoro-2-(pivaloyloxy)propane sulfonate (TAG2)

Commercially available tetra-n-butylammonium hydrogen sulfate, sodium 1,1,3,3,3-pentafluoro-2-(pivaloyloxy) propanesulfonate, dichloromethane and water were added and then stirred. The separated organic layer was washed with water, and dichloromethane was removed under reduced pressure from the washed organic layer. To the residue thus obtained, diethyl ether was added for recrystallization. The resultant was filtrated and dried to obtain a desired product at a yield of 75%.

The structure of the obtained product was identified using $^1$H-NMR, IR and TOFMS spectra.

Synthesis Example 3

Synthesis of triethylammonium 1,1,3,3,3-pentafluoro-2-(benzoyloxy)propanesulfonate (TAG3)

Triethylamine was dissolved in cold water, and hydrochloric acid was added thereto to adjust the pH of the reaction liquid to fall within a range of 1 to 3. Then sodium 1,1,3,3,3-pentafluoro-2-(benzoyloxy)propanesulfonate and dichloromethane were added thereto and stirred. The separated organic layer was washed with water, and dichloromethane was removed under reduced pressure from the washed organic layer. To the residue thus obtained, diethyl ether was added for recrystallization. The resultant was filtrated and dried to obtain a desired product at a yield of 75%.

The structure of the obtained product was identified using $^1$H-NMR, IR and TOFMS spectra.

Synthesis Example 4

Synthesis of triethylammonium 1,1-difluoro-2-(1-naphthyl)ethanesulfonate (TAG4)

Sodium 1,1-difluoro-2-(1-naphthyl)ethanesulfonate was synthesized in the same manner as described in Examples 1 and 2 of Japanese Patent Application Unexamined Publication No. 2004-534719, and then mixed with dichloromethane and an aqueous solution prepared by dissolving triethylamine in cold water to which hydrochloric acid was added to adjust the pH of the reaction liquid to fall within a range of 1 to 3. The separated organic layer was washed with water. To the residue produced by condensing the organic layer, diethyl ether was introduced for recrystallization and purification. The resultant was filtrated and dried to obtain a desired product.

Synthesis Example 5

Synthesis of triethylammonium 1,1,2,2-tetrafluoro-2-(norbornane-2-yl)ethanesulfonate (TAG5) Sodium 1,1,2,2-tetrafluoro-2-(norbornane-2-yl)ethanesulfonate was synthesized in the same manner as described in Synthesis Example 1 of Japanese Patent Application Unexamined Publication No. 2004-2254, and then mixed with dichloromethane and an aqueous solution prepared by dissolving triethylamine in cold water to which hydrochloric acid was added to adjust the pH of the reaction liquid to fall within a range of 1 to 3. The separated organic layer was washed with water. To the residue produced by condensing the organic layer, diethyl ether was introduced for recrystallization and purification. The resultant was filtrated and dried to obtain a desired product.

Synthesis Example 6

Synthesis of triethylammonium 1,1-difluoro-2-(norbornane-2-yl)ethanesulfonate (TAG6)

1,1-difluoro-2-(norbornane-2-yl)ethanesulfonate sodium salt was synthesized in the same manner as described in Japanese Patent Application Unexamined Publication No. 2004-307387, and then mixed with dichloromethane and an aqueous solution prepared by dissolving triethylamine in cold water to which hydrochloric acid was added to adjust the pH of the reaction liquid to fall within a range of 1 to 3. The separated organic layer was washed with water. To the residue produced by condensing the organic layer, diethyl ether was introduced for recrystallization and purification. The resultant was filtrated and dried to obtain a desired product.

TAG 1

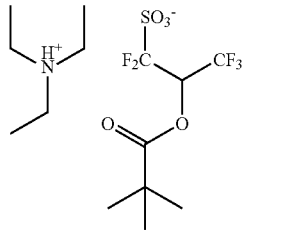

TAG 2

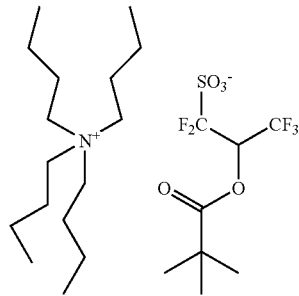

TAG 3

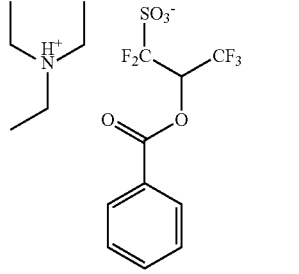

TAG 4

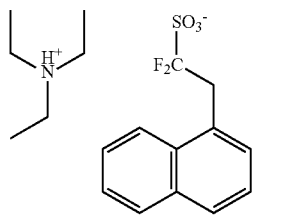

-continued

TAG 5

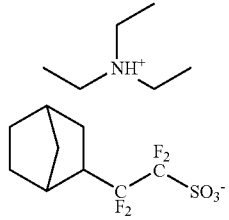

TAG 6

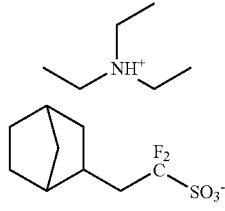

Comparative Synthesis Example 1

Synthesis of Triethylammonium Perfluorobutylsulfonate (Comparative Example TAG1)

Triethylamine was dissolved in cold water, and hydrochloric acid was added thereto to adjust the pH of the reaction liquid to fall within a range of 1 to 3. Then sodium perfluorobutylsulfonate and dichloromethane were added thereto and stirred. The separated organic layer was washed with water, and dichloromethane was removed under reduced pressure from the washed organic layer. To the residue thus obtained, diethyl ether was added for recrystallization. The resultant was filtrated and dried to obtain a desired product at a yield of 75%. The structure of the obtained product was identified using $^1$H-NMR, IR and TOFMS spectra.

Comp.Ex. TAG 1

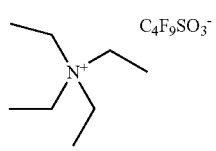

<Preparation of Lower Layer Solution>

As the lower layer polymer 1, a novolac resin (the molar ratio of m-cresol to 1-naphthol: 80:20, Mw: 14000, Mw/Mn: 3.6) obtained through cocondensation of m-cresol and 1-naphthol formaldehyde was used. As the lower layer polymer 2, a novolac resin (Mw: 16000, Mw/Mn: 4.3) obtained through condensation of 4,4'-(9H-fluorene-9-ylidene) bisphenol formaldehyde was used. As the lower layer polymer 3, a copolymer resin (the molar ratio of indene to 4-hydroxystyrene: 70:30, Mw: 14000, Mw/Mn: 1.7) of indene and 4-hydroxystyrene was used. As the lower layer polymer 4, a novolac resin (the molar ratio of 1-naphthol to dicyclopentadiene: 70:30, Mw: 1200, Mw/Mn: 2.8) obtained through cocondensation of 1-naphthol and dicyclopentadiene was used. As the lower layer polymer 5, a copolymer resin (the molar ratio of acenaphthylene to 4-hydroxystyrene of 70:30, Mw: 3500, Mw/Mn: 1.66) of acenaphthylene and 4-hydroxystyrene was used. Using the compositions listed in Tables 1 and 2, lower layer solutions were mixed, which were then filtrated with a high density propylene filter with a pore size of 0.2 μm to prepare lower layer solutions.

<Preparation of Silicon-Containing Intermediate Layer Solution>

A silsesquioxane polymer for silicon-containing film described below was dissolved at the following compositions, and then filtrated with a high density propylene filter with a pore size of 0.2 μm to prepare silicon-containing intermediate layer solutions.

<Preparation of Lower Layer and Silicon-Containing Intermediate Layer>

Each lower layer-forming material solution and each silicon-containing intermediate layer-forming material solution were applied onto a silicon substrate, which were then baked at 220° C. for 60 seconds. Thereby, each lower layer having a thickness of 200 nm was formed (hereinafter simply referred to as "Example lower layers 1 to 13", and "Comparative UDL-1"), and silicon-containing films each having a thickness of 70 nm serving as intermediate layers were formed (hereinafter simply referred to as "SOG1" and "SOG2"). Using a variable incident angle spectroscopic ellipsometer (VASE) available from J. A. Woollam Co., Inc., refractive index (m, k) at a wavelength of 193 nm was determined for lower layers UDL1 to UDL13, Comparative lower layer UDL1, silicon-containing intermediate layers SOG1 and SOG2. The results are shown in Tables 1 and 2. In the tables, "PGMEA" stands for propylene glycol monomethyl ether acetate and "CyH" stands for cyclohexanone.

TABLE 1

| No. | lower layer polymer (parts by weight: pbw) | cross-linking agent (pbw) | acid generator (pbw) | solvent (pbw) | refractive index at 193 nm | |
|---|---|---|---|---|---|---|
| | | | | | n-value | k-value |
| UDL1 | polymer1 (20.0) | CR1 (3) | TAG1 (1) | PGMEA (100) | 1.48 | 0.60 |
| UDL2 | polymer2 (20.0) | CR1 (3) | TAG1 (1) | PGMEA (70) CyH (30) | 1.35 | 0.65 |
| UDL3 | polymer3 (20.0) | CR1 (3) | TAG1 (1) | PGMEA (100) | 1.39 | 0.96 |
| UDL4 | polymer2 (10.0) polymer4 (10.0) | CR1 (3) | TAG1 (1) | PGMEA (70) CyH (30) | 1.44 | 0.35 |
| UDL5 | polymer2 (5.0) polymer4 (17.0) | CR1 (3) | TAG1 (1) | PGMEA (70) CyH (30) | 1.50 | 0.27 |
| UDL6 | polymer3 (10.0) polymer4 (10.0) | CR1 (3) | TAG1 (1) | PGMEA (100) | 1.42 | 0.48 |
| UDL7 | polymer5 (20.0) | CR1 (4) | TAG1 (1) | PGMEA (100) | 1.50 | 0.45 |
| UDL8 | polymer2 (20.0) | CR2 (3) | TAG1 (1) | PGMEA (70) CyH (30) | 1.30 | 0.68 |
| UDL9 | polymer2 (20.0) | CR1 (3) | TAG2 (1) | PGMEA (70) CyH (30) | 1.35 | 0.65 |
| UDL10 | polymer2 (20.0) | CR1 (3) | TAG3 (1) | PGMEA (70) CyH (30) | 1.36 | 0.63 |

TABLE 2

| No. | lower layer polymer (parts by weight: pbw) | cross-linking agent (pbw) | acid generator (pbw) | solvent (pbw) | refractive index at 193 nm | |
|---|---|---|---|---|---|---|
| | | | | | n-value | k-value |
| UDL11 | polymer2 (20.0) | CR1 (3) | TAG4 (1) | PGMEA (70) CyH (30) | 1.37 | 0.64 |
| UDL12 | polymer2 (20.0) | CR1 (3) | TAG5 (1) | PGMEA (70) CyH (30) | 1.37 | 0.64 |
| UDL13 | polymer2 (20.0) | CR1 (3) | TAG6 (1) | PGMEA (70) CyH (30) | 1.37 | 0.64 |
| SOG1 | ArF Si-containg intermediate layer polymer1 (20) | — | Comp. Ex. TAG1 (1) | PGMEA (1000) | 1.8 | 0.23 |
| SOG2 | ArF Si-containg intermediate layer polymer1 (20) | — | TAG1 (1) | PGMEA (1000) | 1.8 | 0.23 |
| Comp. Ex. UDL-1 | polymer2 (20.0) | CR1 (3) | Comp. Ex. TAG1 (1) | PGMEA (70) CyH (30) | 1.35 | 0.69 |

<Preparation of Resist Upper Layer Material>

As the base polymer for three-layer resist upper layer, the following polymer (Monolayer resist polymer 1) was prepared, and as the base polymer for two-layer resist upper layer, the following polymer (Two-layer resist polymer 1) was prepared. The polymers were dissolved at compositions shown in Table 3 given below, which were then filtrated with a high density propylene filter with a pore size of 0.2 μm to prepare upper layer resist solutions.

<Preparation of Resist Lower Layer Material>

The following lower layer polymers 1 to 8 were prepared.

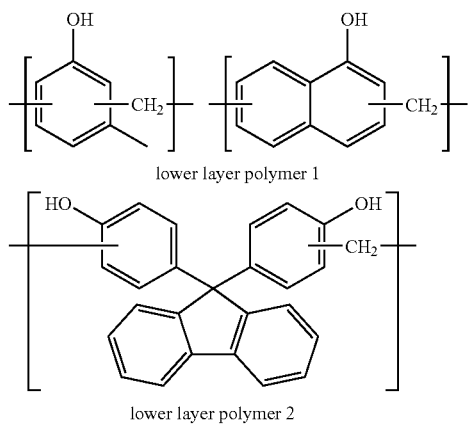

lower layer polymer 1 lower layer polymer 2

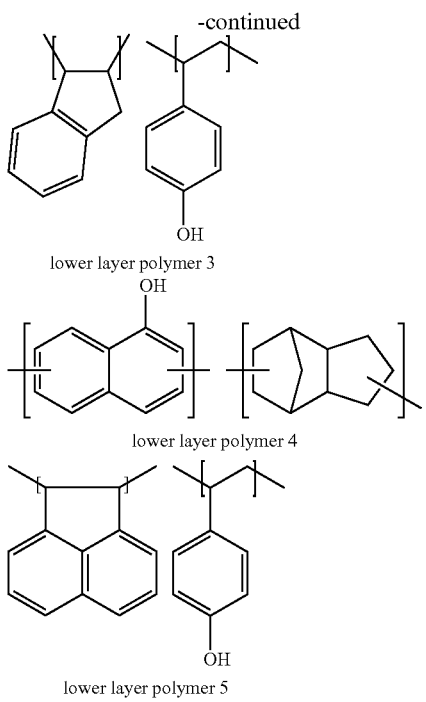

lower layer polymer 3 lower layer polymer 4 lower layer polymer 5

<Observation of Resist Pattern Shape after Development>

Observation of Resist Pattern Shape on Low Dielectric Film Substrate

Porous silica LK-0001 manufactured by Shin-Etsu Chemical Co., Ltd. was spin-coated on a silicon substrate, which was then baked at 400° C. for 60 seconds to produce a low dielectric insulating film having a dielectric constant of 2.5. The low dielectric insulating substrate was immersed in a triethylamine solution, and heated at 80° C. for 10 minutes to allow adsorption of amine component onto the low dielectric film.

Onto the low dielectric insulating substrate having an amine component adsorbed thereto in the manner described above, a solution of any one of resist UDL1 to UDL13 and comparative UDL1 was applied, and then baking was performed at 220° C. for 60 seconds to form a resist lower layer having a thickness of 200 nm.

Subsequently, SOG1 and SOG2 prepared above were applied onto the UDL1 to UDL4, UDL6 to UDL12, and comparative UDL1, followed by baking at 200° C. for 60 seconds to form SOG1 films and SOG2 films having a thickness of 70 nm. The solution of the two-layer resist upper layer material was applied on UDL5, and then baked at 120° C. for 60 seconds to form a two-layer resist upper layer having a thickness of 130 nm.

Then, the solution of the monolayer resist upper layer material prepared above was applied onto the SOG1 films and the SOG2 films applied on UDL1 to UDL4, UDL6 to UDL12, and comparative UDL1, followed by baking at 120° C. for 60 seconds to form monolayer resist upper layers having a thickness of 180 nm.

Thereafter, exposure was performed using an ArF exposure apparatus (manufactured by NIKON CORPORATION; S307E, NA0.85, σ 0.93, 4/5 annular illumination, 6% halftone phase shift mask), followed by baking (PEB) at 110° C. for 60 seconds, and development for 60 seconds using an aqueous solution of 2.38% by weight tetramethylammonium hydroxide (TMAH). Thereby, 75 mL/S (line and space) positive patterns were obtained. The cross sectional pattern shape of the resist thus obtained was observed using an electron microscope (S-4700) manufactured by Hitachi Ltd. The results are shown in Table 4.

As a result, when the resist lower layer materials of Examples 1 to 13 were used, it was confirmed that there was no influence of the base substrate contaminated with amine in the vicinity of the interface between the resist and the base, a shape change that would otherwise occur due to trailing skirts or undercutting did not occur, and thus a rectangular pattern was obtained in each Example.

TABLE 3

| No. | polymer (parts by weight: pbw) | acid generator (pbw) | basic compound (pbw) | solvent (pbw) |
|---|---|---|---|---|
| ArF monolayer resist | ArF monolayer resist polymer1 (100) | PAG1 (4.0) | TMMEA (0.6) | PGMEA (1200) |
| ArF two-layer resist | ArF two-layer resist polymer1 (100) | PAG1 (4.0) | 2NapMp (0.8) | PGMEA (1500) |

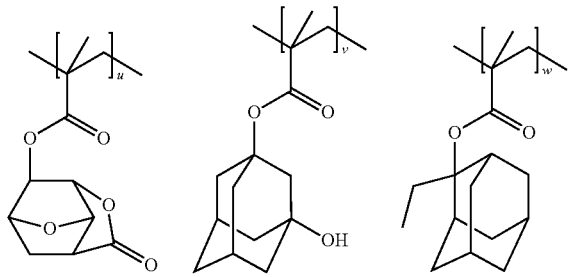

(monolayer resist polymer 1)
(u = 0.40, v = 0.30, w = 0.30  Mw7,800)

TABLE 3-continued
| No. | polymer (parts by weight: pbw) | acid generator (pbw) | basic compound (pbw) | solvent (pbw) |
|---|---|---|---|---|
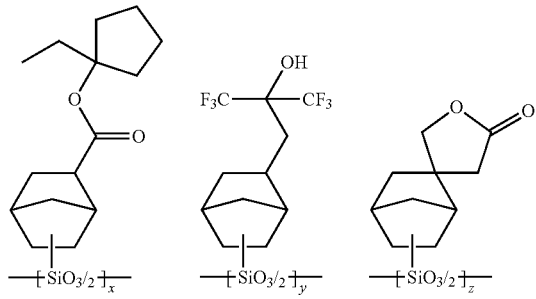
(two-layer resist polymer 1)
(x = 0.20, y = 0.20, z = 0.40  Mw 2,800)
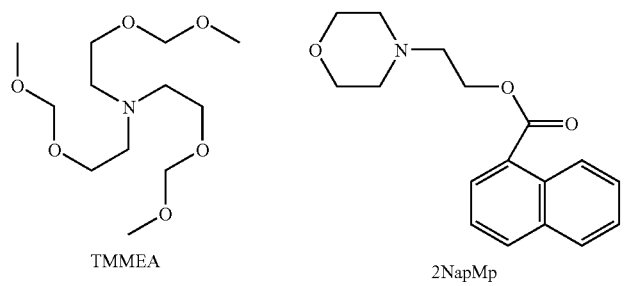
TMMEA  2NapMp
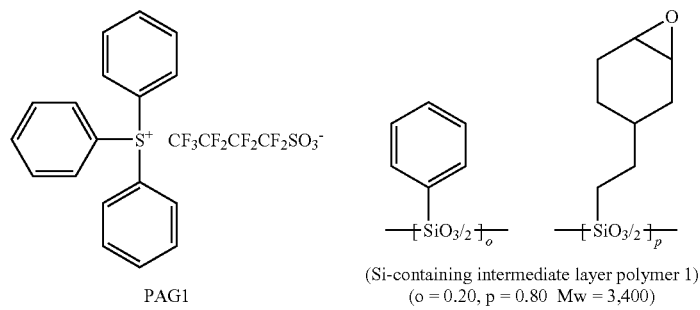
PAG1  (Si-containing intermediate layer polymer 1)
(o = 0.20, p = 0.80  Mw = 3,400)
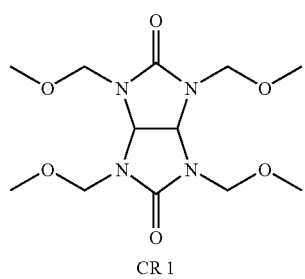
CR 1

TABLE 3-continued

| No. | polymer (parts by weight: pbw) | acid generator (pbw) | basic compound (pbw) | solvent (pbw) |
|---|---|---|---|---|

CR 2

TABLE 4

| | lower layer | intermediate layer | upper layer resist | pattern shape |
|---|---|---|---|---|
| Example 1 | UDL 1 | SOG1 | ArF monolayer resist | rectangular |
| Example 2 | UDL 2 | SOG1 | ArF monolayer resist | rectangular |
| Example 3 | UDL 3 | SOG1 | ArF monolayer resist | rectangular |
| Example 4 | UDL 4 | SOG1 | ArF monolayer resist | rectangular |
| Example 5 | UDL 5 | — | ArF two-layer resist | rectangular |
| Example 6 | UDL 6 | SOG1 | ArF monolayer resist | rectangular |
| Example 7 | UDL 7 | SOG1 | ArF monolayer resist | rectangular |
| Example 8 | UDL 8 | SOG1 | ArF monolayer resist | rectangular |
| Example 9 | UDL 9 | SOG1 | ArF monolayer resist | rectangular |
| Example 10 | UDL 10 | SOG1 | ArF monolayer resist | rectangular |
| Example 11 | UDL 11 | SOG1 | ArF monolayer resist | rectangular |
| Example 12 | UDL 12 | SOG1 | ArF monolayer resist | rectangular |
| Example 13 | UDL 13 | SOG1 | ArF monolayer resist | rectangular |
| Example 14 | UDL 13 | SOG2 | ArF monolayer resist | rectangular |
| Comp. Ex. 1 | Comp. Ex. UDL-1 | SOG1 | ArF monolayer resist | trailing skirt |
| Comp. Ex. 2 | Comp. Ex. UDL-1 | SOG2 | ArF monolayer resist | slightly trailing skirt |

As a result, when the resist lower layer materials of Examples 1 to 14 were used, it was confirmed that there was no influence of the base substrate contaminated with amine in the vicinity of the interface between the resist upper layer and the base, a shape change that would otherwise occur due to trailing skirts or undercutting did not occur, and thus a rectangular pattern was obtained in each Example.

<Observation of Resist Pattern Shape on SiN Substrate>

A 100 nm thick SiN film was produced on a silicon substrate by CVD method. The prepared solutions of resist UDL1 to UDL13 and comparative UDL1 were applied, and then baking was performed at 220° C. for 60 seconds to form resist lower layer s having a thickness of 200 nm.

Subsequently, the above-prepared SOG1 and SOG2 solutions were applied onto the UDL1 to UDL4, UDL6 to UDL12, and comparative UDL1, followed by baking at 200° C. for 60 seconds to form SOG1 films and SOG2 films having a thickness of 70 nm. The solution of the two-layer resist upper layer material was applied on UDL5, and then baked at 120° C. for 60 seconds to form a two-layer resist upper layer having a thickness of 130 nm.

Then, the solution of the monolayer resist upper layer material prepared above was applied onto the SOG1 films and the SOG2 films applied on UDL1 to UDL4, UDL6 to UDL12, and comparative UDL1, followed by baking at 120° C. for 60 seconds to form monolayer resist upper layer s having a thickness of 180 nm.

Thereafter, exposure was performed using an ArF exposure apparatus (manufactured by NIKON CORPORATION; S307E, NA0.85, σ 0.93, 4/5 annular illumination, 6% halftone phase shift mask), followed by baking (PEB) at 110° C. for 60 seconds, and development for 60 seconds using an aqueous solution of 2.38% by weight tetramethylammonium hydroxide (TMAH). Thereby, 75 mL/S (line and space) positive patterns were obtained. The cross sectional pattern shape of the resist thus obtained was observed using an electron microscope (S-4700) manufactured by Hitachi Ltd. The results are shown in Table 5.

TABLE 5

| | lower layer | intermediate layer | upper layer resist | pattern shape |
|---|---|---|---|---|
| Example 1 | UDL 1 | SOG1 | ArF monolayer resist | rectangular |
| Example 2 | UDL 2 | SOG1 | ArF monolayer resist | rectangular |

TABLE 5-continued

| | lower layer | intermediate layer | upper layer resist | pattern shape |
|---|---|---|---|---|
| Example 3 | UDL 3 | SOG1 | ArF monolayer resist | rectangular |
| Example 4 | UDL 4 | SOG1 | ArF monolayer resist | rectangular |
| Example 5 | UDL 5 | — | ArF two-layer resist | rectangular |
| Example 6 | UDL 6 | SOG1 | ArF monolayer resist | rectangular |
| Example 7 | UDL 7 | SOG1 | ArF monolayer resist | rectangular |
| Example 8 | UDL 8 | SOG1 | ArF monolayer resist | rectangular |
| Example 9 | UDL 9 | SOG1 | ArF monolayer resist | rectangular |
| Example 10 | UDL 10 | SOG1 | ArF monolayer resist | rectangular |
| Example 11 | UDL 11 | SOG1 | ArF monolayer resist | rectangular |
| Example 12 | UDL 12 | SOG1 | ArF monolayer resist | rectangular |
| Example 13 | UDL 13 | SOG1 | ArF monolayer resist | rectangular |
| Example 14 | UDL 13 | SOG2 | ArF monolayer resist | rectangular |
| Comp. Ex. 1 | Comp. Ex. UDL-1 | SOG1 | ArF monolayer resist | trailing skirt |
| Comp. Ex. 2 | Comp. Ex. UDL-1 | SOG2 | ArF monolayer resist | slightly trailing skirt |

As a result, when the resist lower layer materials of Examples 1 to 13 were used, it was confirmed that there was no influence of the base substrate contaminated with amine in the vicinity of the interface between the resist and the base, a shape change that would otherwise occur due to trailing skirts or undercutting did not occur, and thus a rectangular pattern was obtained in each Example.

It is to be understood that the present invention is not limited to the embodiments given above. The embodiments given above are merely illustrative, and those having substantially the same configuration as the technical concept defined by the appended claims of the present invention and having similar functions and effects are considered to fall within the technical scope of the present invention.

The invention claimed is:

1. A method for forming a pattern on a substrate by lithography, the method comprising at least steps of:

forming a resist lower layer on a treatment portion of the substrate using a material comprising:

a crosslinkable polymer; and a thermal acid generator that can generate an acid by heating at 100° C. or greater and is represented by the following general formula (1a):

$$R^1CF_2SO_3^-(R^2)_4N^+ \qquad (1a),$$

wherein $R^1$ is a substituted or unsubstituted straight-chain, branched or cyclic $C_1$ to $C_{20}$ alkyl group, which may have —O—, —O—C(=O)—, —C(=O)—, —C(=O)—O—, a hydroxy group, a double bond or a $C_6$ to $C_{20}$ aryl group, and in which one or more hydrogen atoms may be substituted with a fluorine atom, but not all the hydrogen atoms are substituted with fluorine atoms; or a substituted or unsubstituted $C_6$ to $C_{20}$ aryl group in which one or more hydrogen atoms may be substituted with a fluorine atome, but not all the hydrogen atoms are substituted with fluorine atoms; and $R^2$ each independently represents a hydrogen atom; a substituted or unsubstituted straight-chain, branched or cyclic $C_1$ to $C_{10}$ alkyl group, alkenyl group, oxoalkyl group, or alkyl group having a hydroxy group or amino group; a substituted or unsubstituted $C_6$ to $C_{18}$ aryl group, aralkyl group or aryloxoalkyl group; or a group in which at least two of $R^2$ may bond mutually to form a ring together with N in the formula;

forming a resist upper layer on the resist lower layer using a photoresist composition so as to obtain a multilayer resist film comprising at least two layers;

exposing a pattern circuit region of the multilayer resist film to light;

after the exposure, developing the multilayer resist film with a developer to form a resist pattern on the resist upper layer; and etching the resist lower layer and the treatment portion of the substrate using the resist upper layer having the resist pattern formed thereon as a mask so as to form a pattern on the substrate.

2. The method for forming a pattern according to claim 1, wherein said step of forming a resist lower layer employs a material comprising:

a crosslinkable polymer; and a thermal acid generator that can generate an acid by heating at 100° C. or greater and is represented by the following general formula (1a):

$$R^1CF_2SO_3^-(R^2)_4N^+ \qquad (1a),$$

wherein $R^1$ is a substituted or unsubstituted straight-chain, branched or cyclic $C_1$ to $C_{20}$ alkyl group, which may have —O—, —O—C(=O)—, —C(=O)—, —C(=O)—O—, a hydroxy group, a double bond or a $C_6$ to $C_{20}$ aryl group, and in which one or more hydrogen atoms may be substituted with a fluorine atom, but not all the hydrogen atoms are substituted with fluorine atoms; or a substituted or unsubstituted $C_6$ to $C_{20}$ aryl group in which one or more hydrogen atoms may be substituted with a fluorine atome, but not all the hydrogen atoms are substituted with fluorine atoms; and $R^2$ each independently represents a hydrogen atom; a substituted or unsubstituted straight-chain, branched or cyclic $C_1$ to $C_{10}$ alkyl group, alkenyl group, oxoalkyl group, or alkyl group having a hydroxy group or amino group; a substituted or unsubstituted $C_6$ to $C_{18}$ aryl group, aralkyl group or aryloxoalkyl group; or a group in which at least two of $R^2$ may bond mutually to form a ring together ether with N in the formula, wherein said crosslinkable polymer of the resist lower layer material comprises a silicon atom, said step of forming a resist upper layer employs a photoresist composition comprising no silicon atom, and said step of etching comprises etching said lower layer by using said upper layer having a photoresist pattern formed thereon as a mask, and subsequently etching said treatment portion of the substrate by using the lower layer as a mask so as to form a pattern on the substrate.

3. The method for forming a pattern according to claim 1, wherein said step of forming a resist lower layer employs a material comprising:

a crosslinkable polymer; and a thermal acid generator that can generate an acid by heating at 100° C. or greater and is represented by the following general formula (1a):

$$R^1CF_2SO_3^- (R^2)_4N^+ \qquad (1a),$$

wherein $R^1$ is a substituted or unsubstituted straight-chain, branched or cyclic $C_1$ to $C_{20}$ alkyl group, which may have —O—, —O—C(=O)—, —C(=O)—, —C(=O)—O—, a hydroxy group, a double bond or a $C_6$ to $C_{20}$ aryl group, and in which one or more hydrogen atoms may be substituted with a fluorine atom, but not all the hydrogen atoms are substituted with fluorine atoms; or a substituted or unsubstituted $C_6$ to $C_{20}$ aryl group in which one or more hydrogen atoms may be substituted with a fluorine atome, but not all the hydrogen atoms are substituted with fluorine atoms; and $R^2$ each independently represents a hydrogen atom; a substituted or unsubstituted straight-chain, branched or cyclic $C_1$ to $C_{10}$ alkyl group, alkenyl group, oxoalkyl group, or alkyl group having a hydroxy group or amino group; a substituted or unsubstituted $C_6$ to $C_{18}$ aryl group, aralkyl group or aryloxoalkyl group; or a group in which at least two of $R^2$ may bond mutually to form a ring together with N in the formula, wherein said crosslinkable polymer comprises none of a silicon atom, a titanium atom and a germanium atom, but comprises not less than 50% by weight of carbon, said step of forming a resist upper layer employs a photoresist composition comprising a silicon atom, and said step of etching comprises etching said lower layer by using said upper layer having a photoresist pattern formed thereon as a mask, and subsequently etching said treatment portion of the substrate by using the lower layer as a mask so as to form a pattern on the substrate.

4. The method for forming a pattern according to claim 1, wherein said step of forming a resist lower layer employs a material comprising:

a crosslinkable polymer; and a thermal acid generator that can generate an acid by heating at 100° C. or greater and is represented by the following general formula (1a):

$$R^1CF_2SO_3^- (R^2)_4N^+ \qquad (1a),$$

wherein $R^1$ is a substituted or unsubstituted straight-chain, branched or cyclic $C_1$ to $C_{20}$ alkyl group, which may have —O—, —O—C(=O)—, —C(=O)—, —C(=O)—O—, a hydroxy group, a double bond or a $C_6$ to $C_{20}$ aryl group, and in which one or more hydrogen atoms may be substituted with a fluorine atom, but not all the hydrogen atoms are substituted with fluorine atoms; or a substituted or unsubstituted $C_6$ to $C_{20}$ aryl group in which one or more hydrogen atoms may be substituted with a fluorine atome, but not all the hydrogen atoms are substituted with fluorine atoms; and $R^2$ each independently represents a hydrogen atom; a substituted or unsubstituted straight-chain, branched or cyclic $C_1$ to $C_{10}$ alkyl group, alkenyl group, oxoalkyl group, or alkyl group having a hydroxy group or amino group; a substituted or unsubstituted $C_6$ to $C_{18}$ aryl group, aralkyl group or aryloxoalkyl group; or a group in which at least two of $R^2$ may bond mutually to form a ring together with N in the formula, wherein said crosslinkable polymer comprises none of a silicon atom, a titanium atom and a germanium atom, but comprises not less than 50% by weight of carbon;

said step of forming a resist upper layer comprises forming an intermediate layer comprising a silicon atom on said lower layer, and forming a resist upper layer on the intermediate layer using a photoresist composition comprising no silicon atom; and said step of comprises dry-etching the intermediate film layer by using the upper layer having a photoresist pattern formed thereon as a mask, etching the lower layer by using the intermediate film layer as a mask after removing the photoresist pattern layer, and subsequently etching the treatment portion of the substrate by using the lower layer as a mask.

5. The method for forming a pattern according to claim 1, wherein the treatment portion of the substrate is a low dielectric film having a dielectric constant of 3.5 or less or a nitride film.

* * * * *

UNITED STATES PATENT AND TRADEMARK OFFICE
CERTIFICATE OF CORRECTION

PATENT NO.        : 7,871,761 B2
APPLICATION NO.   : 11/881761
DATED             : January 18, 2011
INVENTOR(S)       : Hatakeyama et al.

It is certified that error appears in the above-identified patent and that said Letters Patent is hereby corrected as shown below:

On the Title Page:
Item (75) Inventors: Please correct "Jun Hatakeyama, Joetsu (JP)"
to read -- Jun Hatakeyama, Joetsu-shi (JP) -- and
correct "Toshihiko Fujii, Joetsu (JP)"
to read -- Tokshihiko Fujii, Joetsu-shi (JP) -- and
correct "Youichi Ohsawa, Joetsu (JP)"
to read -- Youichi Ohsawa, Joetsu-shi (JP) --

In the Claims:
Column 48, Claim 4, Line 34: Please correct "step of comprises"
to read -- step of etching comprises --

Signed and Sealed this
Fifth Day of July, 2011

David J. Kappos
*Director of the United States Patent and Trademark Office*